(12) United States Patent
Wang et al.

(10) Patent No.: US 6,597,497 B2
(45) Date of Patent: Jul. 22, 2003

(54) SEMICONDUCTOR OPTICAL AMPLIFIER WITH TRANSVERSE LASER CAVITY INTERSECTING OPTICAL SIGNAL PATH AND METHOD OF FABRICATION THEREOF

(76) Inventors: Shih-Yuan Wang, 766 Encina Grande, Palo Alto, CA (US) 94306; Miao Zhu, 5155 Forest View Dr., San Jose, CA (US) 95129

(*) Notice: Subject to any disclaimer, the term of this patent is extended or adjusted under 35 U.S.C. 154(b) by 1 day.

(21) Appl. No.: 09/972,146

(22) Filed: Oct. 4, 2001

(65) Prior Publication Data

US 2003/0067675 A1 Apr. 10, 2003

(51) Int. Cl.[7] .................................................. H01S 3/00
(52) U.S. Cl. ........................................ 359/344; 359/333
(58) Field of Search ................................. 359/344, 333

(56) References Cited

U.S. PATENT DOCUMENTS

| | | |
|---|---|---|
| 4,742,307 A | 5/1988 | Thylén |
| 4,751,719 A | 6/1988 | Mito et al. |
| 4,939,474 A | 7/1990 | Eisenstein et al. |
| 4,947,401 A | 8/1990 | Hinata et al. |
| 5,184,247 A | 2/1993 | Schimpe |
| 5,291,328 A | 3/1994 | Devlin et al. |
| 5,436,759 A | 7/1995 | Dijaili et al. |
| 5,604,628 A | 2/1997 | Parker et al. |
| 5,654,822 A | 8/1997 | Ducellier et al. |
| 5,673,141 A | 9/1997 | Gambini |
| 5,793,521 A | 8/1998 | O'Brien et al. |
| 6,249,536 B1 | 6/2001 | Farries et al. |

FOREIGN PATENT DOCUMENTS

| | | |
|---|---|---|
| EP | 0851548 | 7/1998 |
| EP | 0899838 | 3/1999 |
| EP | 1085625 | 3/2001 |
| JP | 411307860 A | * 11/1999 |
| WO | WO0128049 | 4/2001 |

OTHER PUBLICATIONS

Agrawal and Dutta, *Semiconductor Lasers*, 2nd ed., Kluwer Academic Publishers (1993) at Chapter 5.

(List continued on next page.)

*Primary Examiner*—Mark Hellner
(74) *Attorney, Agent, or Firm*—Cooper & Dunham, LLP.

(57) ABSTRACT

A semiconductor optical amplifier with increased gain stability is described, comprising a signal waveguide that guides an optical signal along a signal path that intersects with one or more transverse laser cavities. A gain medium of the signal waveguide is integral with a gain medium of the transverse laser cavities at regions of intersection between the signal waveguide and the transverse laser cavities, resulting in gain-stabilized operation when the transverse laser cavities are biased above threshold. Successive transverse laser cavities are separated along the signal path by connecting zones having a higher electrical resistivity than the transverse laser cavities, providing a measure of electrical isolation between the transverse laser cavities and reducing parasitic lasing modes among them. The transverse laser cavities may be provided with separate bias currents for precise control of gain along the signal path. In another preferred embodiment, the transverse laser cavities are segmented in the direction of the lasing field into multiple segments with separate electrical contacts. For certain applications, one or more of the transverse laser cavities may be kept dark near its end mirrors to impede lasing and causing the gain medium to have a nonlinear gain profile for that transverse laser cavity, while other transverse laser cavities along the signal path maintain linear gain profiles. Preferred embodiments with reduced amplified spontaneous emission (ASE) noise are also described.

78 Claims, 15 Drawing Sheets

OTHER PUBLICATIONS

Bachmann, M., Doussiere, P., Emery, J., N'Go, R., Pommereau, F., Goldstein, L., Soulage, G., Jourdan, A., "Polarisation-insensitive clamped-gain SOA with integrated spot-size convertor and DBR gratings for WDM applications at 1.55 ìm wavelength," Electronics Letters, vol. 32, No. 22 (Oct. 24, 1996).

Bernard, J., and Renaud, M., "Tutorial: Semiconductor Optical Amplifiers," SPIE's OE Magazine, Sep. 2001, pp. 36–38.

Bordonalli, "High–Performance Phase Locking of Wide Linewidth Semiconductor Lasers by Combined Use of Optical Injection Locking and Optical Phase–Lock Loop," J. Lightwave Tech. vol. 17, No. 2, pp. 328–342 (Feb. 1999).

Charles, P., "On–Wafer Facet Processing for Low Cost Optoelectronic Components," Electronics Letters, vol. 33, No. 16 (Jul. 31, 1997).

Dollinger et al., "Ultrashort Low–Loss Optical Multiquantum–well GaAs/GaAlAs Vertical Directional Coupler Switch," Electronics Letters, vol. 32, No. 16 (Aug. 1, 1995).

Doussiere, P., Jourdan, A., Soulage, G., Garabedian, P., Graver, C., Fillion, T., Derouin, E., Leclerc, D., "Clamped gain traveling wave semiconductor optical amplifier for wavelength division multiplexing applications," Proceedings of IEEE 14th International Semiconductor Laser Conference (Cat. No.94CH3379–5), Maui, HI, USA, (Sep. 19–23, 1994), pp. 185–186.

Doussiere, P. et al., "1.55 ìm Polarisation Independent Semiconductor Optical Amplifier with 25 dB Fiber to Fiber Gain," IEEE Photonics Technology Letters, vol. 6, No. 2, pp. 170–172 (Feb. 1994).

Duchet, C., et. al., "Polarisation insensitive modulator and influence of propagation direction on bulk electroabsorption," Electronics Letters, vol. 33, No. 3, (Jan. 30, 1997).

Francis, et. al., "A Single Chip Linear Optical Amplifier," IEEE Optical Fiber Communication Conference, Anaheim, CA (2001).

Francois et al., "Horizontal Directional Coupler Filter Suitable for Integraion in a 1.3+/1.3–Duplexer," Electronics Letters, vol. 31, No. 23 (Nov. 9, 1995).

Garbuzov, D. et al., "1.5 micrometers wavelength SCH–MQW InGaAsP/InP broadened waveguide laser diodes with low internal loss and high output power", Electronics Letters, vol. 32, No. 18 (Aug. 29, 1996).

Hofling et al., "Short–Cavity Edge–Emitting Lasers With Deeply Etched Distributed Bragg Mirrors," Electronics Letters, vol. 35, No. 2 (Jan. 21, 1999).

Hofstetter et al, "Ridge waveguide DBR laser with nonabsorbing grating and transparent integrated waveguide," Electronics Letters, vol. 31, No. 12, 1995, p. 980.

Ido, T. et al., "Polarization and Wavelength Insensitive MQW Electroabsorption Optical Gates for WDM Switching Systems," IEEE Photonics Technology Letters, vol. 8, No. 6, pp. 788–790 (Jun. 1996).

Ido, T. et al., "Ultra–High–Speed Multiple–Quantum–Well Electro–Absorption Optical Modulators with Integrated Waveguides," Journal of Lightwave Technology, vol. 14, No. 9, pp. 2026–2034 (Sep. 1996).

Joannopoulos, "Molding the Flow of Light," M.I.T. 2001 Physics Annual (2001) at pp. 32–43.

Lullo et al., "Fabrication of electroabsorption optical modulators using laser disordered GaInAs/GaInAsP multiquantum well structures," Electronics Letters, vol. 30, No. 19, 1994, p. 1623.

Matsumoto, S. et al., "Highly reliable 1.55 micrometers GaInAsP laser diodes buried with semi–insulating iron–doped InP," Electronics Letters, vol. 30, No. 16 (Aug. 4, 1994), pp. 1305–1306.

Morl, L., et al., "Uncladded InGaAsP/InP rib waveguides with integrated thickness tapers for efficient fibre–chip butt coupling," Electronics Letters, vol. 32, No. 1 (Jan. 4, 1996), pp. 36–38.

Nakamura, T. et al., "High efficiency 0.5W/A at 85 degrees C strained multiquantum well lasers entirely grown by MOVPE on p–InP substrate", Electronics Letters, vol. 34, No. 6 (Mar. 19, 1998).

Ortsiefer, M. et al., "Room temperature operation of index guided 1.55 micrometers InP based vertical cavity surface emitting laser," Electronics Letters, vol. 36, No. 5 (Mar. 2, 2000).

Ougazzaden, A. et al., "40 Gb/s Tandem Electro–Absorption Modulator," Optical Fiber Communication Conference and Exhibit, pp. PD14–1 to PD14–3, Optical Society of America, Anaheim, California (Mar. 17–22, 2001).

Samsung Electronics, *GA40B3A 1550 nm Clamped Semiconductor Optical Amplifier Module: Technical Data Sheet*, 10–page technical data sheet from Samsung Electronics Optoelectronics Division (Aug. 2001), available on or before Dec. 3, 2001 at http://samsungelectronics.com/fiberoptics/downloads/ga40b3.pdf.

Shibata et al., "Semiconductor Monolithic Wavelength Selective Router Using Grating Switch with Directional Coupler," Electronics Letters, vol. 31, No. 12 (Jun. 8, 1995).

Verbeek, Bart H., "Semiconductor Optical Amplifiers: Basics and Applications," 64–page Booklet handed out at the International Semiconductor Laser Conference 2000, Short Course 3, Monterey, California (IEEE, Sep. 24–28, 2000).

Wiedmann et al., "Singlemode Operation of Deeply Etched Coupled Cavity Laser With DBR Facet," Electronics Letters, vol. 36, No. 14 (Jul. 6, 2000).

Zhang, B. et al., "High speed InGaAs/InP selective proton bombarded buried cresent lasers with optical field attenuation regions," Electronics Letters, vol. 34, No. 1 (Jan. 8, 1998).

Oct. 1, 2001, Previous News Analysis, "Kamelian to Upstage Genoa"? Amerstdam—ECOC 2001 [European Conference on Optical Communication which takes place in Amersterdam from 30th Sep. to 4th Oct. 2001].

Kawano et. al., "4×4 InGaAlAs/InAlAs MQW Directional Coupler Waveguide Switch Modules Integrated with Spot–Size Converters and Their 10 Gb/s Operation," Electronics Letters, vol. 31, No. 2 (Jan. 19, 1995).

Kohtuku, M., et al., InP based 64 channel arrayed waveguide grating with 50 GHz channel spacing and up to—dB crosstalk, Electronics Letters, vol. 33, No. 21, (Oct. 9, 1997).

Lam et. al., "Plasma immersion Ar+ ion implantation induced disorder in strained InGaAsP multiple quantum well," Electronics Letters, vol. 34, No. 8, (Apr. 16, 1998).

Liu et al., "Optical Add/Drop Multiplexers Based on X–Crossing Vertical Coupler Filters," IEEE Photonics Technology Letters, vol. 12, No. 4 (Apr. 2000).

Liu, B., et. al., "Fused InP–GaAs vertical coupler filters," IEEE Photonics Technology Letters, vol. 11, No. 1, (Jan. 1999), pp. 93–95.

Loncar et al., "Waveguiding in Planar Photonic Crystals," Applied Physics Letters vol. 77, No. 13 (Sep. 25, 2000) at pp. 1937–1939.

* cited by examiner

SEMICONDUCTOR OPTICAL AMPLIFIER WITH TRANSVERSE LASER CAVITY INTERSECTING OPTICAL SIGNAL PATH AND METHOD OF FABRICATION THEREOF

FIELD

This patent specification relates to optical amplifiers. More specifically, it relates to a semiconductor optical amplifier capable of using transverse lasing to excite its gain medium.

BACKGROUND

As the world's need for communication capacity continues to increase, the use of optical signals to transfer large amounts of information has become increasingly favored over other schemes such as those using twisted copper wires, coaxial cables, or microwave links. Optical communication systems use optical signals to carry information at high speeds over an optical path such as an optical fiber. Optical fiber communication systems are generally immune to electromagnetic interference effects, unlike the other schemes listed above. Furthermore, the silica glass fibers used in fiber optic communication systems are lightweight, comparatively low cost, and are capable of very high-bandwidth operation.

Optical amplifiers are important components of optical communications links. Optical amplifiers are commonly used as (i) power amplifiers at the source end of an optical communications link, (ii) line amplifiers along the optical signal transmission path, and (iii) preamplifiers at the receiving end of the optical communications link, and have other uses as well.

In general, the two primary types of optical amplifiers are optical fiber based amplifiers, such as erbium doped fiber amplifiers (EDFAs) and Raman amplifiers, and semiconductor optical amplifiers (SOAs). EDFAs are widely used in line amplifiers and other applications requiring high output power, high data rates, and low noise. However, EDFAs are quite bulky, having a typical fiber length of about 30 feet, and require the presence of a separate pumping laser to operate. Accordingly, EDFAs are difficult to incorporate into confined spaces, and are not amenable to circuit-board-level or chip-level integration.

SOAs, on the other hand, are small in size and conveniently integrated into small devices. An SOA generally resembles a semiconductor laser structure, except that the end mirrors have been replaced by antireflection coatings. In such devices the product of the gain and the reflectivity is less than one so that the device does not oscillate. Rather, the device is used to amplify an incoming optical signal as it passes through the device. Such devices are often called traveling wave amplifiers, which highlights the fact that the optical signal does not pass back and forth within the device, but merely passes through it essentially only once. SOAs generally yield lower output power and higher noise levels as compared to EDFAs, and/or are restricted to lower data rates. Research continues toward improving the performance of SOAs, including making SOAs with higher power and lower noise characteristics, and/or that are capable of operating at higher data rates.

Crosstalk is one of the primary troublesome noise sources in conventional SOAs, with amplified spontaneous emission (ASE) being the other primary troublesome noise source. Crosstalk, or cross-channel modulation, involves data-dependent gain fluctuations at high output levels from the SOA, and can occur for either time-multiplexed or wavelength-multiplexed data. Crosstalk arises from gain saturation effects in an SOA. These effects can be understood by recalling that SOA devices rely on the phenomenon of stimulated emission to provide the necessary amplification. Stimulated emission, in turn, requires the establishment of a population inversion. In typical SOAs or lasers a population inversion is evidenced by the presence of a specified carrier density. When a sufficiently large optical signal is passed through the amplifier, the population inversion is substantially reduced or depleted, i.e. the gain of the SOA is saturated, and is reestablished only over some finite period of time. Consequently, the gain of the SOA will be reduced for some period of time following the passage of the signal through the amplifier, a time period commonly denoted as the amplifier gain recovery time.

When the gain medium becomes saturated due to a high signal level on a first channel, changes are induced in the signal level of a second channel because the saturated gain medium cannot properly amplify both channels. Since gain is modulated by the first signal, this modulated gain is impressed on the second signal. Thus, for wavelength division multiplexed (WDM) systems in which a plurality of channels at $\lambda_1, \lambda_2, \ldots, \lambda_N$ are present in a common optical signal, gain saturation induced by a first channel at $\lambda_1$ can produce unwanted level changes (i.e., errors) in a second data channel at $\lambda_2$, and vice versa.

Crosstalk can be reduced by keeping the SOA out of gain saturation for the data rates, signal levels, and number of channels on the optical signal of interest. If the SOA is operated near gain saturation levels, crosstalk may be reduced by making the period of the data signals small in comparison to the gain recovery time, i.e., by slowing down the data rate. In general, an SOA will have reduced crosstalk effects if (i) its saturation power $P_{SAT}$, i.e., the input optical power level for which the SOA gain is reduced to a predetermined percentage of its nominal value, is increased, and/or (ii) its gain recovery time is decreased. As used herein, an SOA has increased gain stability if (i) its saturation power $P_{SAT}$ is increased without a concomitant increase in gain recovery time, (ii) its gain recovery time is decreased without a concomitant decrease in saturation power $P_{SAT}$, or (iii) both (i) and (ii) occur.

Several methods for dealing with crosstalk problems are discussed in U.S. Pat. No. 5,436,759, which is incorporated by reference herein. One strategy is to place a transverse laser across the SOA such that the laser's gain medium and the SOA's signal gain medium share an overlapping region. The lasing cavity is operated above threshold and the gain of the laser is clamped to overcome losses of the cavity. As used herein, a laser cavity is gain-clamped and lasing when it is excited by a bias current greater than a threshold current. When the transverse laser is gain-clamped, gain along the SOA signal path is stabilized. The transverse lasing enhances the establishment and maintenance of a population inversion in the overlapping region, resulting in both increased saturation power and a decreased gain recovery time. Advantageously, independent lasing only builds up in the transverse direction and does not corrupt the quality of the amplified signal.

The '759 patent supra discusses an SOA in which an input optical signal is amplified by a signal gain medium along a signal path, the signal path being intersected by a segmented optical cavity oriented off-axis (e.g., perpendicular) to the signal path. The optical cavity is a lasing cavity operated above threshold, and shares its gain medium with the signal gain medium at overlapping locations, thereby increasing gain stability. Certain segmentation and design techniques are proposed for dealing with parasitic lasing modes that can cause gain clamping at undesirably low levels, with some designs directed to suppressing the parasitic lasing modes (e.g., '759 patent, FIG. 1), and other designs directed to constructively using circulating modes (e.g., '759 patent, FIG. 2B) to increase the gain. To suppress parasitic lasing modes, the lasing cavity is segmented along the length of the amplifier with regions that are optically isolated, except at intersections with the gain medium/signal path. In some examples, the optical isolation is achieved by placing gaps between the cavities that include opaque barriers ('759 patent, FIG. 1), while in other examples angled trenches are used ('759 patent, FIG. 2C).

The proposed designs of the '759 patent supra can suffer from one or more shortcomings that can reduce the effectiveness of the device and/or cause difficulty in reliably fabricating the device. For example, the layers of the single active medium ('759 patent, FIG. 1) can be difficult to construct reliably with consistent thickness across the entire lateral area to be covered. In addition, the semiconductor layers may contain local defects such as crystal dislocations, pitting, voids, etc. Such defects in the epitaxial growth can be a point of lower electrical resistance than the surrounding epitaxial areas. The higher electrical current flowing through these points of lower electrical resistance can create "hot spots" which cause non-uniform gain in the effected areas. In addition to the less than optimal performance resulting form the non-uniform gain, the "hot spots" can be a source of excessive current drain and premature device failure. As another example, undesired parasitic modes or uneven lasing may arise due to lack of electrical isolation among laser cavity segments at intersections with the signal gain medium.

Another approach to gain saturation reduction is discussed in Francis, et. al., "A Single Chip Linear Optical Amplifier," IEEE Optical Fiber Communication Conference, Anaheim, Calif. (2001), which is incorporated by reference herein, in which the amplifier and a vertical cavity surface emitting laser (VCSEL) share the same active region. However, these devices can have limited output power due to the small gain medium volume of VCSELs, as well as for other reasons. These devices can also suffer from non-uniform current flows and hot spots due to defects in crystal growth and non-uniform epitaxial layers.

An SOA experiencing crosstalk and other gain saturation effects is generally operating in a nonlinear region of operation, in which the signal gain is not a constant value over time. Such an SOA is generally not desirable for use as an amplifier in an optical communications link. However, devices with nonlinear input-output characteristics are increasingly finding use in other applications, including all-optical gating applications, wavelength conversion applications, and all-optical signal regeneration applications.

Accordingly, it would be desirable to provide a semiconductor optical amplifier having reduced crosstalk effects.

It would be further desirable to provide a semiconductor optical amplifier that can have an adjustable gain along its length, such that the gain can be adjusted at the factory and/or in the field during operation.

It would be still further desirable to provide a semiconductor optical amplifier that can optionally be adjusted to have nonlinear gain characteristics along one or more segments of the signal path, while having linear gain characteristics along other segments of the signal path.

It would be even further desirable to provide such a semiconductor optical amplifier in which amplified spontaneous emission (ASE) noise is reduced in the output.

It would be even further desirable to provide such a semiconductor optical amplifier that is more robust against variations in gain medium thickness and/or other crystal defects.

It would be still further desirable to provide such a semiconductor optical amplifier in which the operating current requirements are kept low.

It would be even further desirable to provide such a semiconductor optical amplifier that can be reliably fabricated.

SUMMARY

According to a preferred embodiment, a semiconductor optical amplifier (SOA) apparatus and related methods are provided for amplifying an optical signal, the SOA comprising a signal waveguide for guiding the optical signal along a signal path, the SOA further comprising a gain medium that is excited by the lasing fields of two or more transverse laser cavities intersecting the signal waveguide along the signal path. The transverse laser cavities are biased above a threshold current to achieve gain-clamped operation, wherein gain stability along the signal path is increased and crosstalk in the amplified optical signal is reduced. According to a preferred embodiment, the transverse laser cavities are non-overlapping, each transverse laser cavity intersecting the signal waveguide at its own distinct region of intersection.

As the optical signal propagates down the signal waveguide, it encounters the regions of intersection and is amplified by the excited gain medium therein. Between the regions of intersection along the signal path, the optical signal encounters areas of reduced amplification or loss, termed connecting zones. According to a preferred embodiment, the connecting zones comprise at least one portion of wave guiding material having an increased electrical resistivity as compared to corresponding wave guiding material in the regions of intersection. This provides a measure of electrical isolation between adjacent transverse laser cavities as they intersect the signal waveguide, reducing unwanted parasitic lasing modes among the transverse laser cavities.

The connecting zones may be maintained at or near a condition of transparency while having little or no gain, such that gain guiding in the transverse laser cavities is facilitated. It has been found that several advantages associated with the increased-resistance connecting zones, e.g., electrical isolation of transverse lasing cavities for increased SOA gain profile control in terms of both amplitude and wavelength, reduction of parasitic lasing modes, etc., can justify any reduction in amplification caused by the increased-resistance connecting zones along the signal path, provided that the overall gain is sufficient. According to a preferred embodiment, the percentage of the signal path occupied by the connecting zones is substantially less than the percentage of the signal path occupied by the regions of intersection of the transverse laser cavities such that positive-gain operation is achieved.

According to a preferred embodiment, the transverse laser cavities are electrically separated along their lengths (in the propagation direction of the amplified signal) by proton-implanted isolation regions, which include the connecting zones. Optionally, the degree of electrical isolation in the connecting zones may be different than that in the remainder of the isolation regions. According to a preferred embodiment, the gain medium lying in the connecting zones is disordered or partially disordered, thereby reducing signal losses in the connecting zones. In contrast, in areas corresponding to the remainder of the isolation regions, the gain medium is not disordered. Because there is essentially no current in these areas, optical isolation between adjacent transverse laser cavities is provided in these areas in addition to electrical isolation. In an alternative preferred embodiment, all of the gain medium in the isolation regions is disordered. In this alternative preferred embodiment, the electrical isolation alone between adjacent transverse laser cavities is sufficient to achieve operational segregation and reduction of unwanted parasitic lasing modes.

A variety of geometric layouts for the transverse laser cavities may be used in accordance with the preferred embodiments. The transverse laser cavities may be substantially perpendicular to the signal waveguide, or may alternatively be at a different non-perpendicular angle. In one preferred embodiment, the transverse laser cavities are oriented at the Brewster angle with respect to the signal waveguide for reducing reflections at the interfaces of dissimilar materials. In another preferred embodiment, the transverse laser cavities are optically connected with mirrors to form a single folded-path laser with multiple crossings of the signal waveguide.

According to a preferred embodiment, the transverse laser cavities are provided with separate electrical contacts so that they may be biased at different currents and current density levels. The separate control of the current to different transverse laser cavities allows for compensation for local hot spots caused by crystal dislocations, voids, or other local defects in the semiconductor material. Different groupings or couplings may be made among the electrical contacts of the transverse laser cavities. In another preferred embodiment, the SOA can be operated as a variable optical attenuator (VOA) by variably reducing the bias currents of one or more transverse lasers, such that the collective gain at the regions of intersection is overcome by the collective loss at the connecting zones.

According to another preferred embodiment, an SOA is provided comprising a signal waveguide for guiding an optical signal along a signal path, the SOA further comprising a gain medium that is excited by the lasing field of one or more multi-contact transverse laser cavities intersecting the signal waveguide along the signal path. Each multi-contact transverse laser cavity comprises two end mirrors defining a laser cavity therebetween, the laser cavity being segmented along the direction of the lasing field into a center segment and at least one end segment, the end segments and the center segment each having their own current source for biasing. In a first configuration, the end segments are provided with no bias current, thereby impeding gain clamping in the laser cavity and causing gain nonlinearities along the signal path. In a second configuration, the end segments are provided with bias currents sufficient to facilitate gain clamping in the laser cavity, thereby allowing linear gain along the signal path. Accordingly, depending on the amount bias current through the end segments, which may be dynamically controlled, the multi-contact transverse laser cavity may effectuate linear or nonlinear gain along its respective portion of the signal path. In a preferred embodiment, a plurality of multi-contact transverse laser cavities intersect the signal path including first and second subsets thereof, the first subset operating in linear-gain mode and the second subset operating in nonlinear-gain mode.

According to another preferred embodiment, amplified spontaneous emission (ASE) noise in the output can be reduced by including a second signal waveguide resonantly coupled with a first signal waveguide. The optical signal is amplified by the first signal waveguide in a gain-stabilized manner by a gain medium excited by one or more transverse lasing cavities intersecting the first signal waveguide. The optical signal is then transferred into the second signal waveguide prior to output. The ASE generated along the first signal waveguide does not couple effectively into the second signal waveguide, and ASE in the output is thereby reduced. Optionally, the second signal waveguide may also provide some amplification of the optical signal. Optionally, tunable coupling between the waveguides can be provided such that the degree of coupling can be controlled by electrical, optical, mechanical, or other signals.

DETAILED DESCRIPTION

Figure 1:
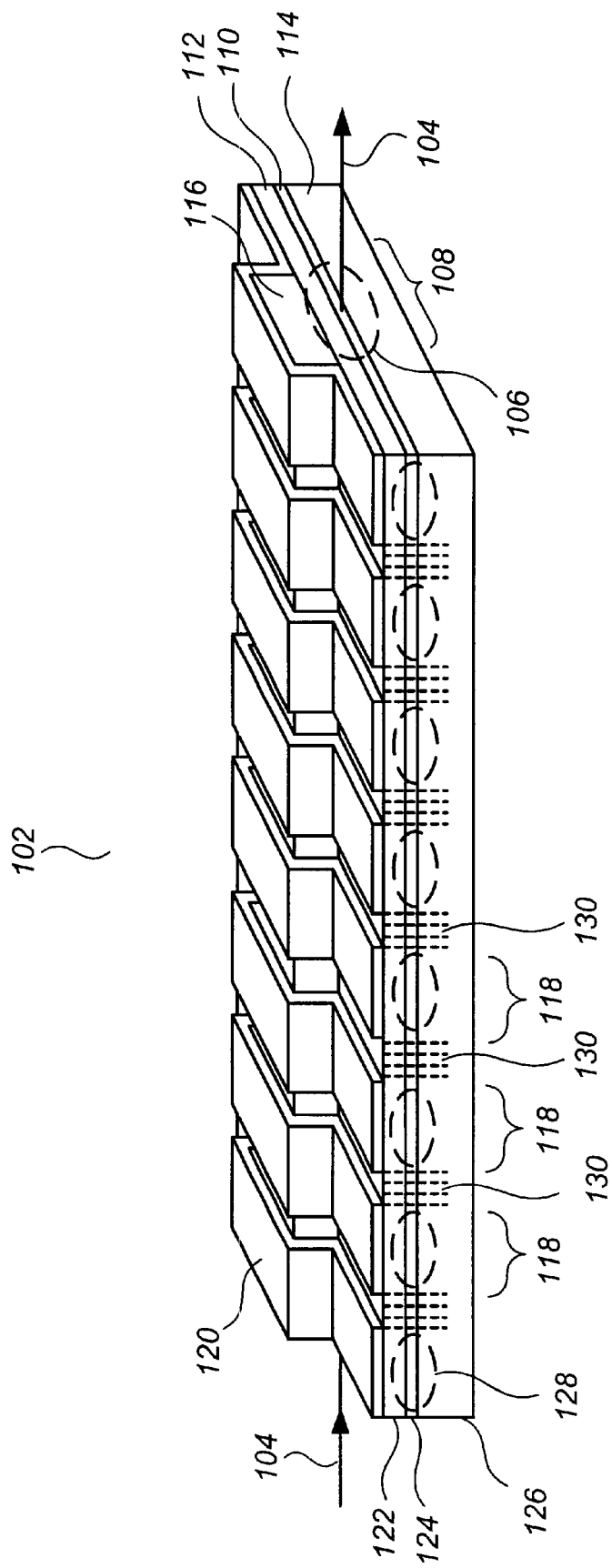
FIG. 1 illustrates a perspective view of a semiconductor optical amplifier (SOA) in accordance with a preferred embodiment.

FIG. 1 illustrates a perspective view of a semiconductor optical amplifier (SOA) 102 in accordance with a preferred embodiment. SOA 102 receives an optical signal 104 at an input, guides the optical signal 104 along a signal waveguide 108 while also amplifying it, and provides an amplified version of the optical signal 104 at an output as indicated in FIG. 1. Shown by dotted lines in FIG. 1 is an optical path 106, to generally represent a field pattern of the optical signal 104 as it propagates down the signal waveguide 108. Signal waveguide 108 is formed by a signal gain medium 110, an upper cladding layer 112, a lower cladding layer 114, and a ridge element 116 as shown in FIG. 1. The signal gain medium 110 has an index of refraction that is slightly higher than the indices of refraction of the upper and lower cladding layers 112 and 114, respectively, to provide vertical confinement of the optical signal 104. The presence of ridge element 116, which may comprise material similar to that of upper cladding layer 112, provides for horizontal confinement of the optical signal 104. In addition to providing optical gain for the optical signal 104, the gain medium serves as a core of the signal waveguide 108. In alternative preferred embodiments, additional core layers may be included above and/or below the signal gain medium 110. Antireflective coatings (not shown) are provided at the input and output of the SOA 102 to minimize reflections.

According to a preferred embodiment, the SOA 102 is configured to provide for single-mode propagation and amplification of a long-wavelength (e.g., above 1200 nm) infrared optical signal. Accordingly, the SOA 102 is useful for amplifying optical signals common in long-haul WDM communications networks. Importantly, however, the scope of the preferred embodiments is not so limited, the features and advantages of the preferred embodiments being readily extendible to multimode propagation and/or signals of different wavelengths. In the single-mode, long-wavelength embodiment of FIG. 1, the gain medium 110 comprises multiple quantum wells of InGaAsP/InGaAs/InP. The upper cladding layer 112 and ridge element 116 comprise p-doped InP, while the lower cladding layer 114 comprises n-doped InP. The lower cladding layer 114 is over an n-doped InP substrate (not shown), which in turn is over a lower ohmic contact (not shown), these elements being omitted from FIG. 1 for clarity of description.

The SOA 102 further comprises a plurality of transverse laser cavities 118 that intersect the signal waveguide 108. There are eight (8) such transverse laser cavities 118 in the embodiment of FIG. 1, although there may be many more (e.g., tens or even hundreds) such transverse laser cavities 118, or as few as two of them. In certain preferred embodiments described infra in which the transverse laser cavities are segmented in the direction of the lasing field and separately biased, there may be as few as one transverse laser cavity. Each of the transverse laser cavities 118 may have its own distinct set of end mirrors (not shown in FIG. 1 for clarity of description) such that it forms a distinct laser. Alternatively, two or more of the transverse laser cavities 118 may be concatenated at their ends by the use of angled end mirrors to form one or more folded-path or "meandering line" lasers, as will be described further infra. The transverse laser cavities 118 may be substantially identical to each other, or may alternatively have different characteristics for achieving different device functionalities.

According to a preferred embodiment, two or more of the transverse laser cavities 118 are driven by separate electrical current sources (not shown). As will be described further infra, several advantages may be brought about by the use of separate driving currents, including increased fine-tuning ability, the ability to cause more uniform currents through the laser gain medium, the ability to fine-tune the overall gain curve versus wavelength, avoidance of hot-spots and other manufacturing defects, increased fabrication yields, and other advantages. By separate electrical current sources, it is meant that each of the transverse laser cavities 118 may be provided with a different amount of current. Any of a variety of different electrical arrangements may be used for achieving the separate electrical current sources. For example, the separate electrical current sources may be implemented in the form of a thin film circuit (not shown) comprising a common current source that branches out to the transverse laser cavities 118 through different resistive values $R_1, R_2, \ldots, R_n$. The resistive values $R_1, R_2, \ldots, R_n$ may be fine-tuned once at the factory or, in an alternative embodiment, may be dynamically adjustable for fine-tuning in the field. The fine-tuning may be associated with a feedback control system, associated with an open loop control system, or associated with a variety of different tuning actuation mechanisms.

Each transverse laser cavity 118 comprises an upper ohmic contact 120, an upper cladding layer 122, a laser gain medium 124, and a lower cladding layer 126, the lower cladding layer 126 being over a substrate (not shown) and a lower ohmic contact (not shown). The lower ohmic contact (not shown) may be shared among all of the transverse laser cavities 118. An intermediate ohmic contact layer (not shown) comprising a low band gap epitaxial layer such as p-doped InGaAsP is provided between the upper ohmic contact 120 and upper cladding layer 122. This intermediate ohmic contact layer also lies between the ridge element 116 and the upper ohmic contact 120. Responsive to an electrical current through the laser gain medium 124, a transverse lasing field builds up in each transverse laser cavity 118, which is indicated in FIG. 1 by a dotted region 128 in the area of the laser gain medium 124. The laser gain medium 124 has an index of refraction that is slightly higher than the indices of refraction of the upper and lower cladding layers 122 and 126, respectively, to provide vertical confinement of the transverse lasing field.

Importantly, according to a preferred embodiment, and as indicated in FIG. 1, the laser gain medium 124 comprises the same material layers as the signal gain medium 110 of the signal waveguide 108, these components being integral at regions of intersection between the signal waveguide 108 and the transverse laser cavity 118. Preferably, the upper cladding layers 112 and 122, and the lower cladding layers 114 and 126, respectively, of the signal waveguide 108 and the transverse laser cavities 118, also comprise the same material layers and are shared at these regions of intersection, as indicated in FIG. 1. Advantageously, the amplification of the optical signal 104 as it proceeds down the signal waveguide 108 is provided by a gain medium that is itself excited by a transverse lasing field operating above threshold. Generally speaking, the saturation power is increased and the gain recovery time is reduced. Accordingly, gain saturation effects including crosstalk are substantially reduced. For notational simplicity herein, gain medium 110 will denote the signal gain medium along the signal waveguide 108 as well as the laser gain medium of the transverse laser cavities 118, as appropriate. Also, upper cladding layer 112 will denote the upper cladding layer along the signal waveguide 108 as well as the laser gain medium of the transverse laser cavities 118 as appropriate, and lower cladding layer 114 will denote the lower cladding layer along the signal waveguide 108 as well as the laser gain medium of the transverse laser cavities 118 as appropriate The transverse laser cavities 118 are separated by electrical isolation regions 130, which are described further infra. Among other functions, the electrical isolation regions 130 provide for electrical isolation of adjacent transverse laser cavities 118. This allows for gain-guided lateral confinement of the transverse lasing field and a reduction in the amount of parasitic lasing occurring in the transverse laser cavities.

As the optical signal 104 travels down the signal waveguide 108, it encounters the regions of intersection between the signal waveguide 108 and the transverse laser cavity 118. It is in these regions of intersection that the optical signal 104 is amplified. Between these regions, however, the optical signal 104 encounters areas corresponding to the electrical isolation regions 130, these areas being termed connecting zones. The optical signal 104 will generally not be amplified in the connecting zones running between the regions of intersection, although a small amount of amplification may occur in some preferred embodiments infra. In general, however, it has been found that the advantages associated with the presence of connecting zones, e.g., electrical isolation of transverse lasing cavities for increased tunability and control, reduction of parasitic lasing modes, increased ability to precisely tune the gain curve versus wavelength, etc., justify any reduction in amplification caused by them, provided that the overall amplification is sufficient. According to a preferred embodiment, the percentage of optical signal path occupied by the regions of intersection is sufficient to establish positive amplification of the optical signal 104. While the specific percentage will depend on the specific dimensions and materials used in the device, this percentage will usually be greater than about eighty percent. Mode converters known in the art can be used to couple the optical signal 104 into and out of optical fibers.

Figure 2:
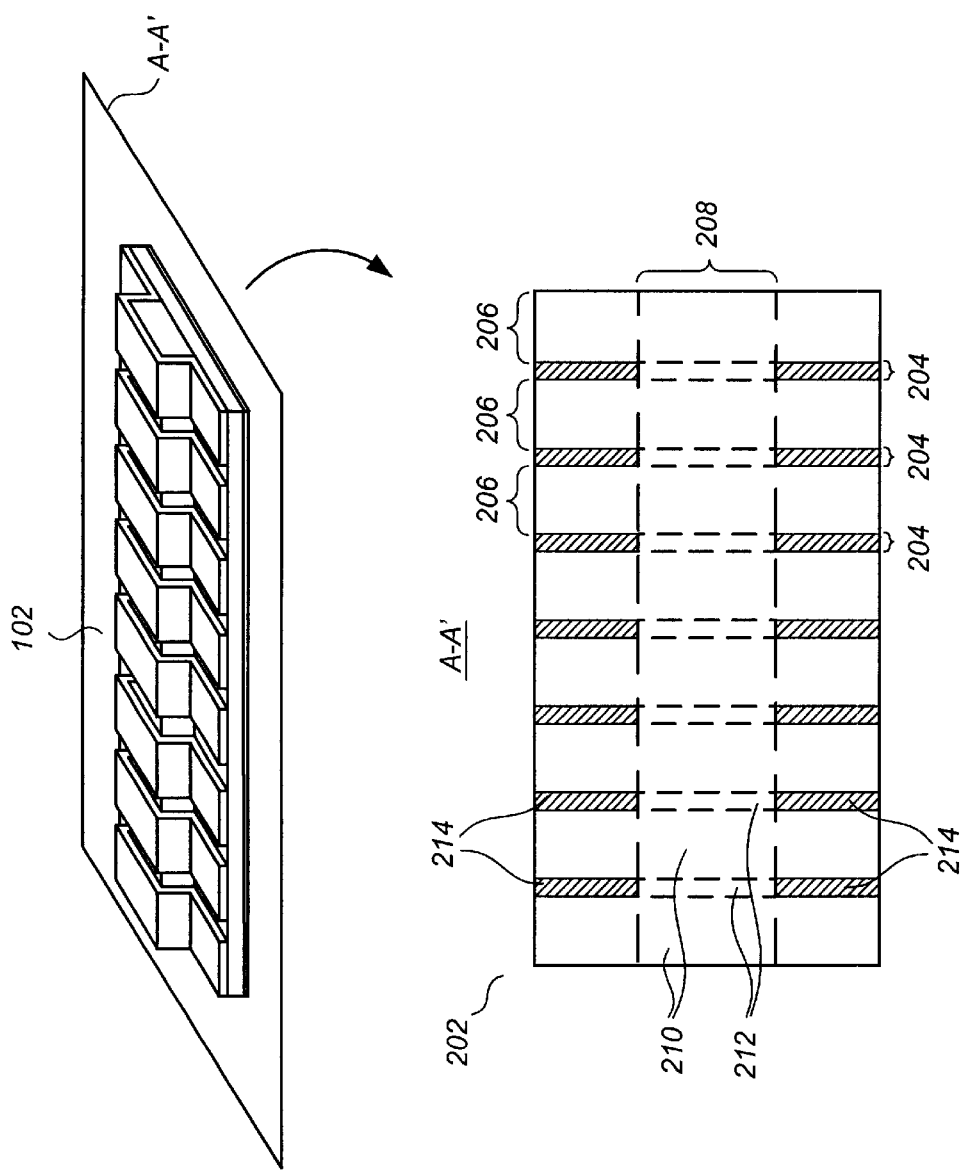
FIG. 2 illustrates a first cross-sectional view of the SOA of FIG. 1.

FIG. 2 illustrates a cross-sectional view of the SOA 102 taken along a horizontal plane A–A' parallel to and intersecting the planes of the gain medium 110. In this plane, the SOA 102 comprises a quantum well layer 202 extending the length and width of the device. During device fabrication, the quantum well layer 202 is initially formed as a single, homogeneous slab with no differences between the several regions indicated in FIG. 2. Cladding layers above and below the quantum well layer 202 are also formed as single, homogeneous slabs. Subsequent processing steps (e.g., implantation, disordering, etching, trenching, etc.) are then performed as will be specified further infra to achieve the desired material characteristics.

Quantum well layer 202 comprises several different regions corresponding to different regions of the overall SOA 102 as are now described. A first set of strips 204 laterally correspond to the electrical isolation regions 130 of FIG. 1 at the quantum well layer 202. A second set of strips 206 correspond to the transverse laser cavities 118 of FIG. 1 at the quantum well layer 202. A strip 208 corresponds to the signal waveguide 108 at the quantum well layer 202. Generally speaking, the vertical extent of the strip 208 in FIG. 2 will correspond to the width of the ridge element 116, although the scope of the preferred embodiments is not so limited.

Each strip 204 is ion-implanted to increase electrical resistivity, thereby providing electrical isolation between the strips 206 corresponding to the transverse laser cavities 118. Cladding layers above and below the isolating strips 204 within isolation regions 130 (see FIG. 1) are likewise implanted, providing electrical isolation among adjacent transverse laser cavities 118 of FIG. 1. Each strip 204 comprises a central portion 212 that intersects with the strip 208 and corresponds to the connecting zones described supra. Each strip 204 further comprises outer portions 214 that do not intersect with the strip 208. According to a preferred embodiment, subsequent to ion implantation of the strips 204, the quantum wells of the central portions 212 are disordered to decrease the amount of optical attenuation associated with the connecting zones along the optical signal path. In contrast, the outer portions 214 are not disordered. As known in the art, a non-disordered quantum well that is not biased with current will cause the material to be very optically lossy, e.g., having a loss of about −3 dBm/$\mu$m to −10 dB/$\mu$m or more depending on its thickness and other factors. Therefore, by not disordering the outer portions 214, a measure of optical isolation is provided between adjacent transverse laser cavities along their length in addition to electrical isolation. The electrical resistivity profile along the strips 204/electrical isolation zones 130 may be fixed, or alternatively may vary in the direction of the transverse lasing field or in the direction of the optical signal being amplified.

The set of strips 206 corresponding to the transverse laser cavities 118 are generally not modified subsequent to the formation of quantum well layer 202, although the scope of the preferred embodiments is not so limited. It is along these strips 206 that gain for the transverse lasing field is incurred, as well as gain for optical signal 104. The strips 206 intersect the strip 208, and are integral therewith, at areas 210. These areas 210 correspond to the regions of intersection between the signal waveguide 108 and the transverse laser cavity 118 as described supra.

Preferably, the signal waveguide 108 is designed to have a numerical aperture that approximates that of a single mode optical fiber for maximum coupling efficiency. End facets of the signal waveguide 108 are anti-reflection coated to reduce reflection loss and to prevent any spontaneous emission from oscillating.

Figure 3:
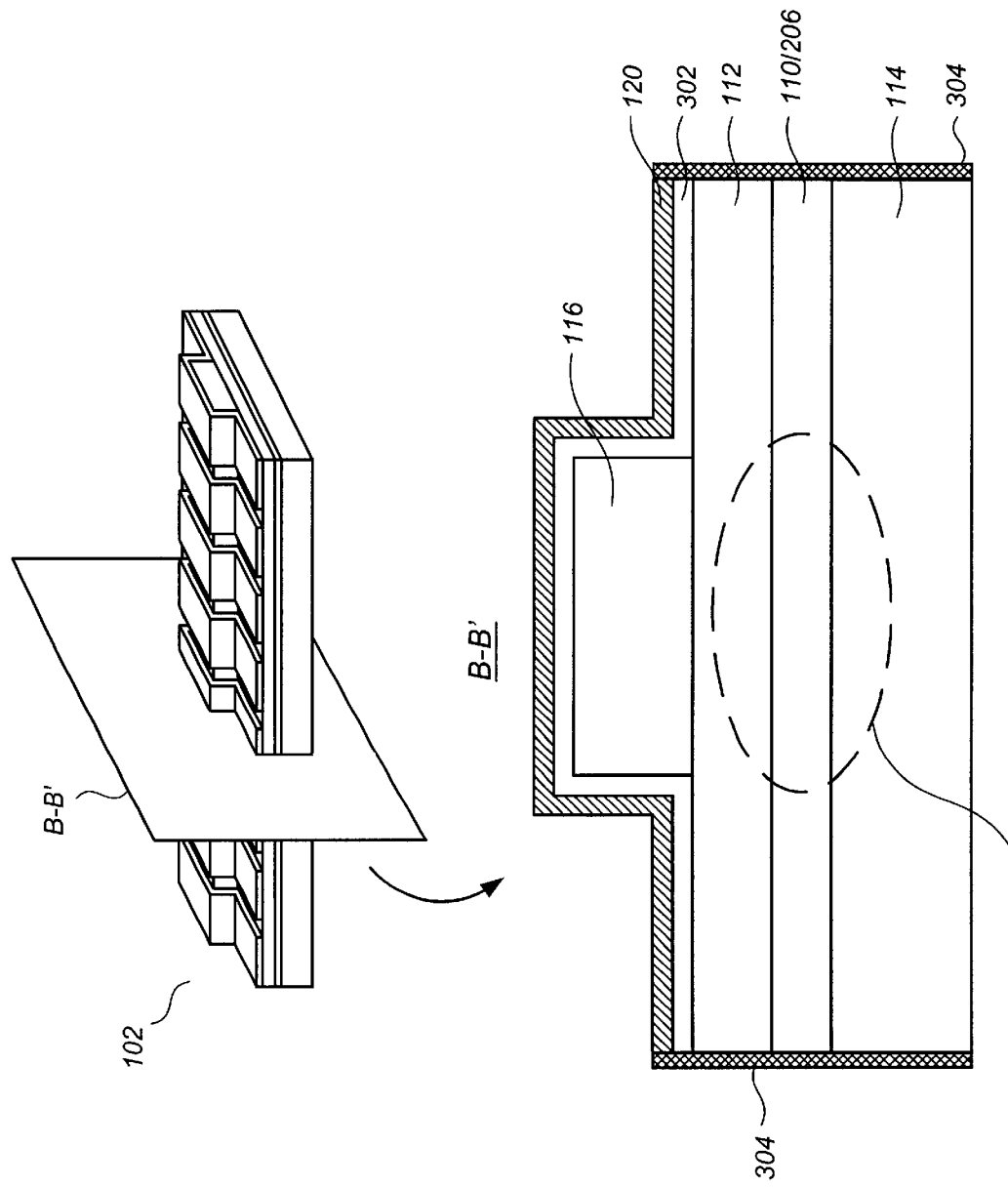
FIG. 3 illustrates a second cross-sectional view of the SOA of FIG. 1.

FIG. 3 illustrates a cross-sectional view of the SOA 102 taken along a vertical plane B–B' parallel to and intersecting one of the transverse laser cavities 118. In addition to showing the ridge element 116, the upper ohmic contact layer 120, the upper cladding layer 112, the gain medium 110/206, the lower cladding layer 114, and the dotted line optical path 106, FIG. 3 shows an intermediate ohmic contact layer 302 made of, e.g., p-doped InGaAsP, and also shows end mirrors 304 of the transverse laser cavity 118. By way of example and not by way of limitation, typical dimensions may include a transverse laser cavity length of about 30–50 $\mu$m, a ridge width of about 5–20 $\mu$m, a gain medium height of about 0.1–0.5 $\mu$m, and upper and lower cladding thicknesses of about 1–3 $\mu$m. However, a wide variety of device dimensions, materials, and layer thicknesses may be used in accordance with the preferred embodiments. For example, the transverse laser cavity length may even be made as short as 15 $\mu$m for reducing the amount of bias current necessary for lasing, provided that the cavity width is reduced accordingly as will be described further infra. The substrate (not shown) and lower ohmic contact (not shown) are omitted from FIG. 3 for clarity of description. For shorter cavity lengths such as 30 $\mu$m, it is preferable to dry-etch the facets of the lasing cavity and deposit a highly reflective coating thereon to form the end mirrors 304. This is because it is difficult to cleave end facets that are so close together.

Figure 4:
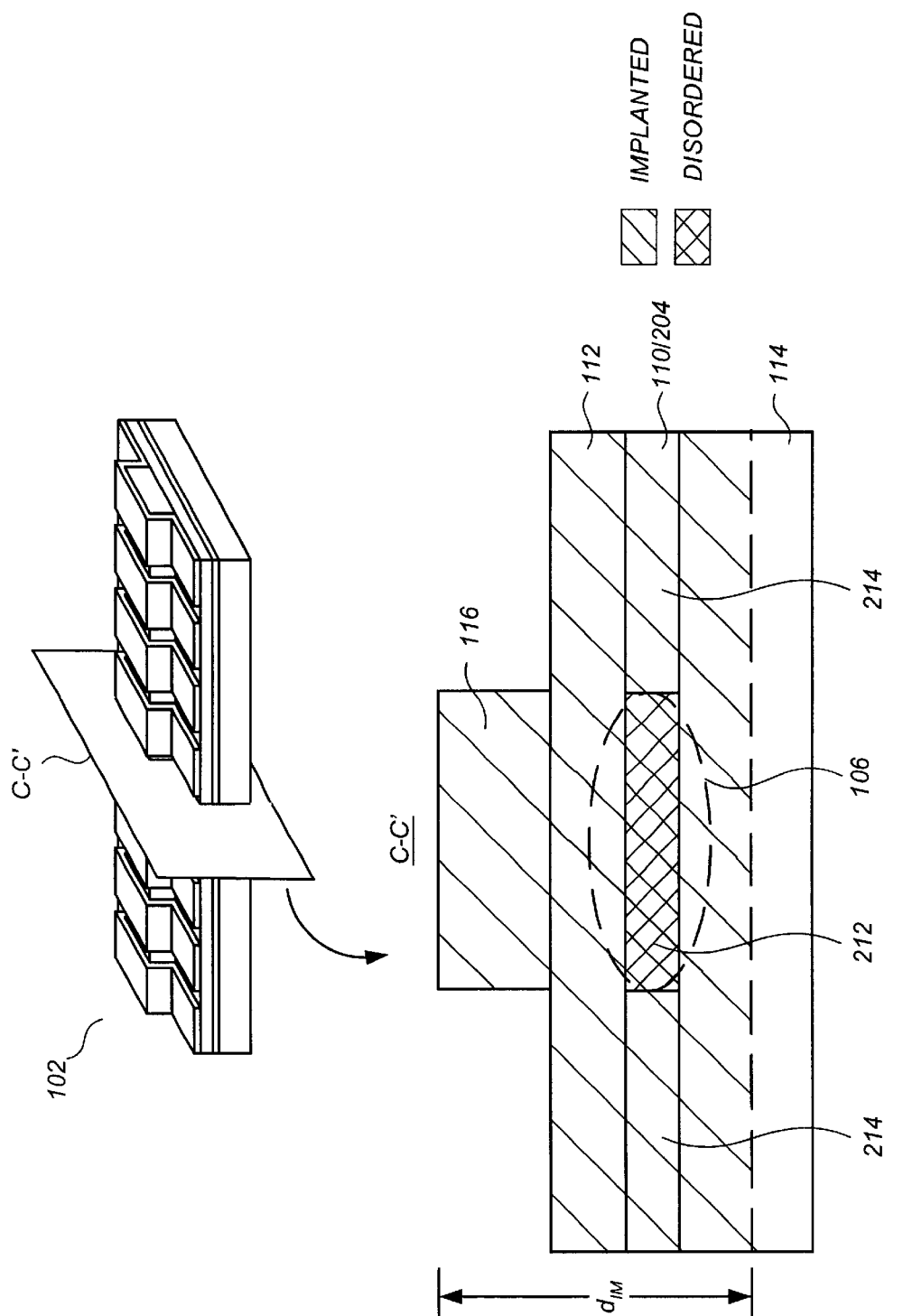
FIG. 4 illustrates a third cross-sectional view of the SOA of FIG. 1.

FIG. 4 illustrates a cross-sectional view of the SOA 102 taken along a vertical plane C–C' parallel to and intersecting one of the electrical isolation zones 130. As indicated in FIG. 4, the ion implantation process for electrical isolation affects the ridge element 116, the upper cladding layer 112, the gain medium 110/204, and the lower cladding layer 114 down to a depth $d_{IM}$ from the top of the ridge element 116, usually penetrating only part of the lower cladding layer 114. The quantum well disordering process is only applied to the central portion 212 of the isolation region quantum well strips 204 (see FIG. 2) that correspond to the connecting zones. The outer portions 214 of the isolation region quantum well strips 204 are not disordered. The substrate (not shown) and lower ohmic contact (not shown) are omitted from FIG. 4 for clarity of description.

Figure 5:
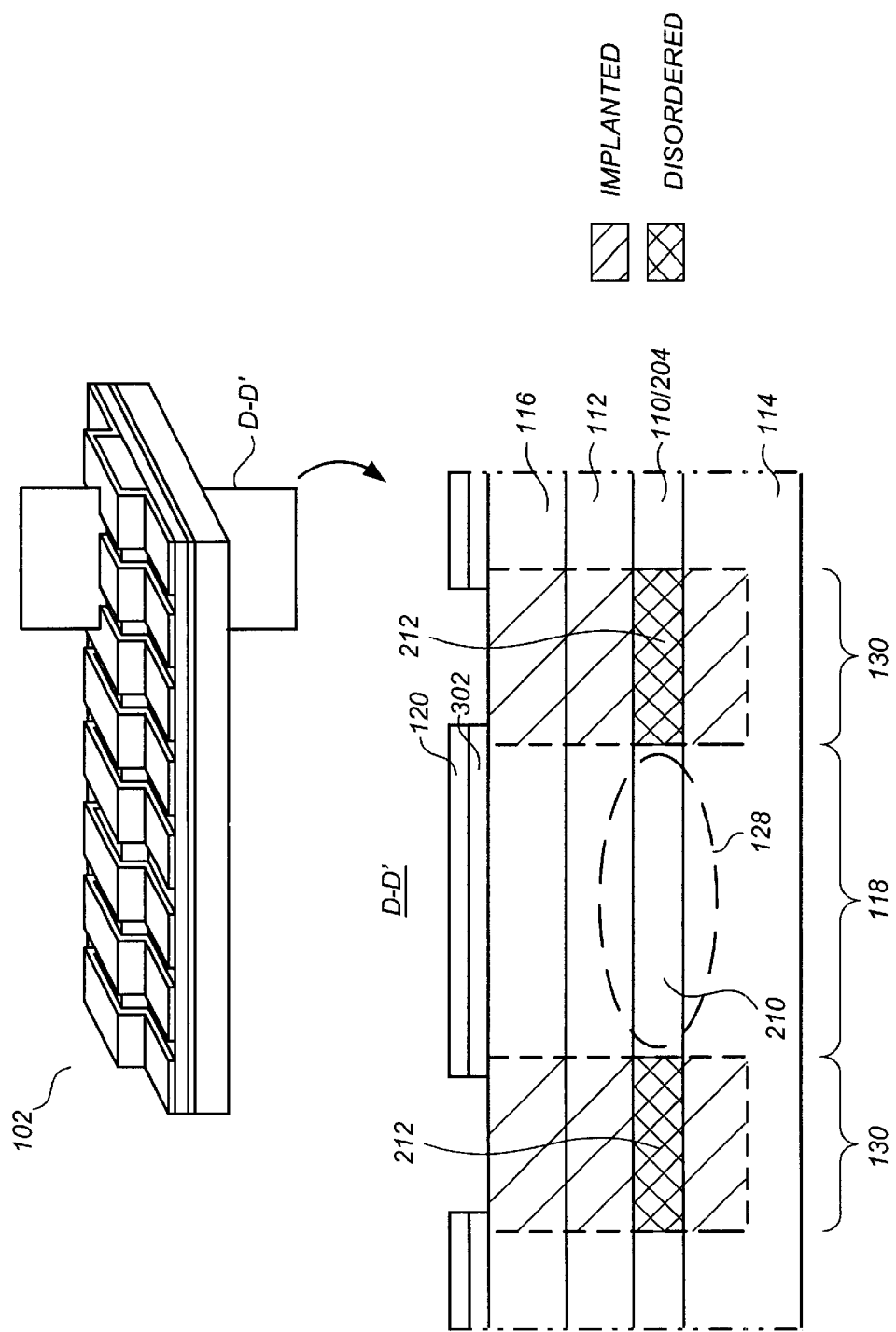
FIG. 5 illustrates a fourth cross-sectional view of the SOA of FIG. 1.

FIG. 5 illustrates a cross-sectional view of the SOA 102 taken along a vertical plane D–D' parallel to and intersecting the signal waveguide 108 down its center axis, extending across one of the transverse laser cavities 118 and into neighboring transverse laser cavities. Shown in FIG. 5 are the transverse laser cavity 118, the upper ohmic contact 120, the intermediate ohmic contact layer 302, the upper cladding layer 112, the gain medium 110/208, and the lower cladding layer 114. Shown between adjacent laser cavities is a cross-section of the ion-implanted isolation region 130, which also reveals the disordered region 212 corresponding to the connecting zones described supra. Also shown in FIG. 5 is the non-disordered region 210 corresponding to the region of intersection between the signal waveguide 108 and the transverse laser cavity 118 described supra. Also shown in FIG. 5 is the dotted outline 128 generally representing the transverse lasing field of the transverse laser cavity 118. By way of example and not by way of limitation, a typical width of the transverse laser cavity 118 may be about 6 $\mu$m–10 $\mu$m. However, a wide variety of device dimensions may be used in accordance with the preferred embodiments. The transverse laser cavity 118 has a cavity length corresponding to the distance between end mirrors 304 (see FIG. 3) and a cavity width corresponding to the width of the non-disordered region 210 in FIG. 5. Preferably, the cavity length to cavity width ratio of each of the transverse laser cavities 118 is greater than or equal to about 5:1 to reduce unwanted parasitic lasing modes. As described supra, it is preferable that the connecting zones, which correspond to isolation regions 130 in FIG. 5, be kept short along the signal path (the left-to-right direction in FIG. 5) as compared to the width of the transverse laser cavity 118, to achieve gain-clamped operation.

In an alternative preferred embodiment, instead of performing proton isolation and/or disordering in the isolation regions 130, these regions may instead be trenched and filled with InP regrowth. The trenches would extend down through the gain medium layer so that the isolation regions 130, including the connecting zones, contain no gain medium. In this case, the transverse laser cavities would be isolated by virtue of the inactive InP regrowth lying between them. Preferably, a minimal refractive index difference would exist between the InP regrowth regions and the transverse laser cavity regions, so that reflections along the signal path are reduced.

Figure 6:
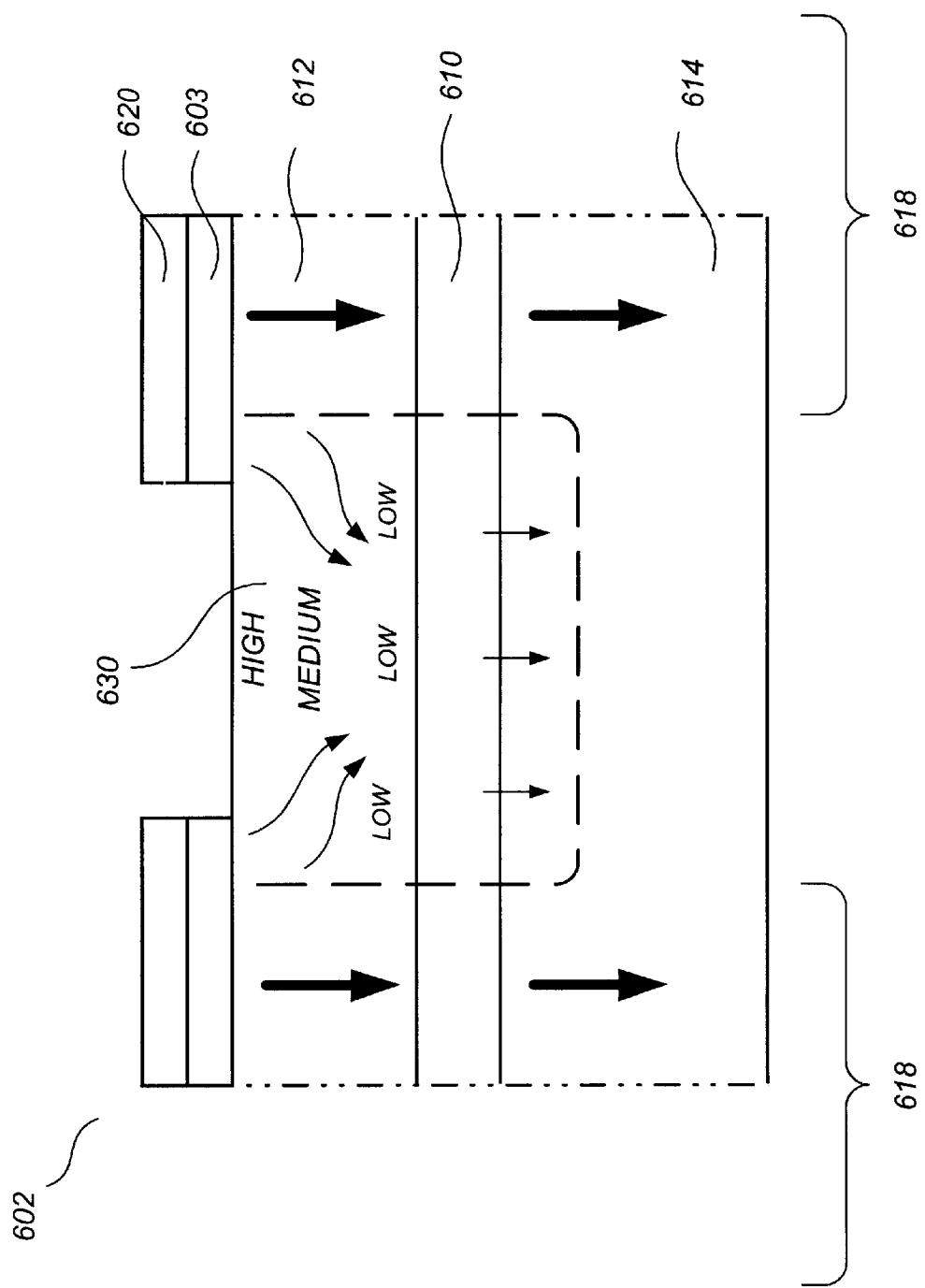
FIG. 6 illustrates a cross-sectional view of an SOA in accordance with a preferred embodiment.

FIG. 6 illustrates a cross-sectional view of a portion of an SOA 602 in accordance with a preferred embodiment, in which quantum well portions lying in connecting zones between neighboring transverse laser cavities are not disordered, but rather are biased to transparency using current from the neighboring transverse lasers. The portion of SOA 602 of FIG. 6 is taken in cross-section similar to the cross-section D–D' of FIG. 5. The SOA 602 of FIG. 6 is similar to the SOA 102 of FIG. 1, e.g., comprises transverse laser cavities 618 similar to the comprises transverse laser cavities 118 of FIG. 1, upper ohmic contacts 620 similar to the upper ohmic contacts 120 of FIG. 1, intermediate ohmic contact layer 603 similar to the intermediate ohmic contact layer 302 of FIG. 3, and successive layers 612, 610, and 614 similar to the layers 112, 110, and 114 of FIG. 1. However, in an isolation region 630 lying between two transverse laser cavities 618, the ion implantation process is adjusted using known methods to yield a resistivity profile such that a small amount of current (small arrows) bleeds off from the current destined for the quantum wells of the transverse laser cavities (large arrows) to bias the quantum well portion of the connecting zone to transparency, or perhaps to a small amount of gain. At the same time, however, there is still an appreciable degree of electrical isolation between the adjacent transverse laser cavities to allow separate lasing control, prevent parasitic lasing modes, etc. A rough outline of one such resistivity profile is shown by the notations HIGH, MEDIUM, and LOW in FIG. 6, although any of a variety of different resistivity profiles may be used.

Substantial advantages arise from the fact that substantially all of the gain for the optical signal 104 is produced by the plurality of transverse laser cavities 118. The transverse laser cavities 118 are gain-clamped when operated above threshold, which in turn causes the saturation power $P_{SAT}$ for the SOA signal path to be increased and the gain recovery time to be decreased. Accordingly, the gain of the SOA 102 has increased stability, and crosstalk is reduced.

In an alternative preferred embodiment, all regions under the signal waveguide 108 corresponding to connecting zones are electrically injected with their own bias current, in order to ensure that all of the signal path 106 is maintained at transparency or gain. This can be achieved using a separate set of electrical contacts between the contacts 120 of FIG. 1.

Figure 7:
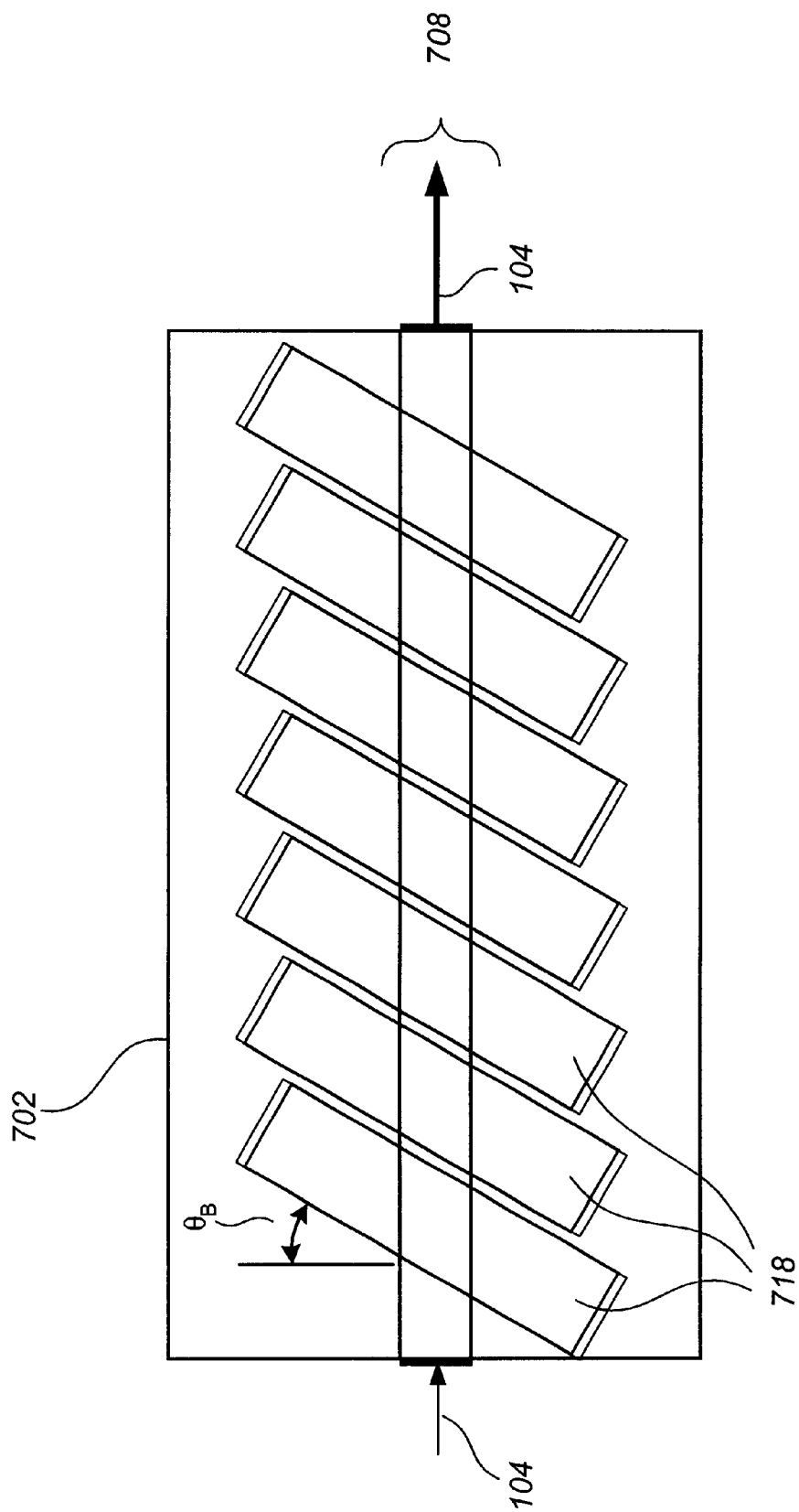
FIG. 7 illustrates a top view of an SOA in accordance with a preferred embodiment.

FIG. 7 illustrates a simplified top view of an SOA 702 in accordance with a preferred embodiment. It has been found that reflections associated with the connecting zones, generally caused at the boundaries between the ordered and disordered quantum well regions, should be kept as low as possible, e.g., to less than one percent. According to a preferred embodiment, transverse laser cavities 718 are oriented with respect to a signal waveguide 708 at an angle that is equal to the Brewster angle $\theta_B$ for the materials in question. This is advantageous in minimizing the effect of internal reflections from the interface of dissimilar materials, since an ordinary ray of the optical signal 104 which is incident on the material interface at the Brewster angle $\theta_B$ will be completely transmitted or nearly so, thereby reducing the amount of reflection at the interface.

Figure 8:
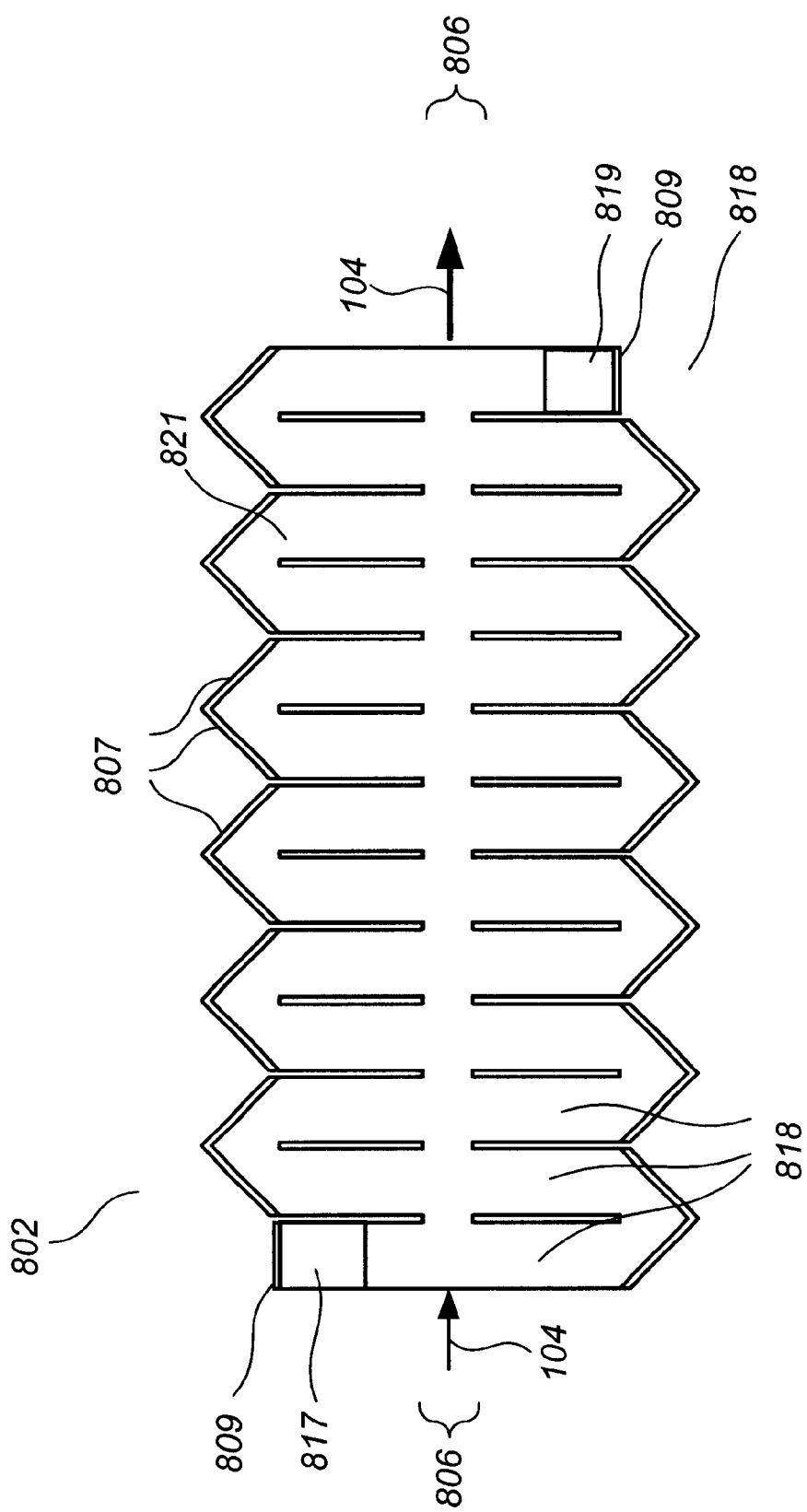
FIG. 8 illustrates a top cut-away view of an SOA having a folded-path transverse laser cavity in accordance with a preferred embodiment.

FIG. 8 illustrates a simplified top cut-away view of an SOA 802 having a folded-path transverse laser in accordance with a preferred embodiment, corresponding to a horizontal slice at the gain medium layer. The SOA 802 is similar to the SOA 102 of FIG. 1, comprising a plurality of transverse laser cavity portions 818 across an optical path 806. However, the transverse laser cavity portions 818 are connected in sequence by reflective couplers 807 to form a single folded-path laser which has many crossings of optical path 806 between a single set of end mirrors 809. Various combinations of straight-line and folded-path lasers may be used in accordance with the preferred embodiments. The end mirrors 809 should be high-reflectivity (HR) coated to further reduce the lasing threshold and required current density. As with the straight-path transverse lasers of the preferred embodiments supra, the folded-path laser need not be single mode.

The reflective couplers 807 may be implemented by free-space trenches at the end of the respective transverse laser cavity portions 818. The interior surfaces of the trenches face each other at substantially a right angle, and each trench is aligned at substantially a 45 degree angle with respect to the axis of the respective transverse laser cavity portion 818. Due to the difference in index of refraction between the free space trench and the semiconductor material of the transverse laser cavity portions 818, total internal reflection takes place and the trenches effectively act as mirrors. Assuming that the bulk of the transverse laser cavity material has an index of refraction of about 3.3, the trenches can be filled with any material having an index of refraction less than about 2.3. This will provide for total internal reflection at an incident angle of 45 degrees.

In an alternative embodiment, in order to minimize bias current requirements, the transverse laser cavity portions 818 may be tapered such that they are wider near the intersection with the optical path 806 but are narrow elsewhere. This reduces the volume of lasing material in the transverse laser cavity portions 818, thereby reducing overall current requirements. Tapered lasing cavities may be used in conjunction with either the straight-line or folded-path embodiments described supra, or with other embodiments.

Bias current must be provided to energize the device. In general, the transverse laser cavity portions must all be supplied with current. This requirement, however, allows for a number of options in arranging the electrical contacts. According to one preferred embodiment, in the example of FIG. 8 the upper surface of the folded-path laser shares a single electrical contact by which the device is energized from a single electrical source. This has benefits in lower cost and simplicity of operation. Preferably, however, a plurality of separate electrical contacts is used. By way of example, superimposed on FIG. 8 are three separate electrical contact regions 817, 819, and 821. The primary contact region is region 821, covering most of the folded-path laser, with regions 817 and 819 being smaller. In one example, the primary contact region 821 may have a fixed bias current, while the current may be adjusted in the smaller contact regions 817 and 819 for fine-tuning of the lasing field. In other examples, the folded-path laser may be segmented into tens or even hundreds of separate electrical contact regions for precise control of the lasing field.

In another example, the smaller contact regions 817 and 819 may turned completely "off" or "dark" during a first time interval, and "on" during a second time interval. When the bias current is "off" in the contact regions 817 and 819, the effect is to "cut out" the end mirrors and impede gain-clamped operation of the folded-path laser. This causes the SOA 802 to have an unstable, nonlinear gain profile during the first time interval. When the contact regions 817 and 819 are "on," gain-clamped operation of the folded-path laser is resumed and the SOA 802 has a stabilized, linear gain profile. Accordingly, by modulating the bias currents for the contact regions 817 and 819, the SOA 802 may be dynamically taken in and out of nonlinear operation. Although not generally for use in a standard WDM signal amplification environment, there are a variety of uses for devices that can be taken in and out of nonlinear operation, for example, in the fields of optical gating, wavelength conversion, or optical signal regeneration.

In addition to the electrical separation required at the contacts of regions 817, 819, and 821, the underlying laser cavity portions down through the quantum well layer should also be electrically isolated. This can be achieved by forming ion-implanted strips between the regions 817, 819, and 821 that also have a disordered quantum wells. Thus, these ion-implanted strips are similar in structure the connecting zones lying along the signal path between adjacent transverse laser cavity portions, in that they are electrically resistive yet substantially optically transparent. This allows the regions 817, 819, and 821 to be separately biased and yet be part of the same lasing cavity.

The use of separate electrical bias currents is especially practical and useful when there are several separate transverse lasing cavities, each having its own set of end mirrors, with all transverse lasing cavities being electrically isolated from each other. The overall length of an SOA in accordance with the preferred embodiments may vary greatly, e.g. from as short as 300 $\mu$m to as long as 10000 $\mu$m. Thus, if each transverse lasing cavity is about 10 $\mu$m wide, this allows for anywhere between 30 and 1000 separate transverse lasing cavities, each of which may be separately electrically biased. When provided with distinct bias currents, some or all of the different transverse laser cavities may be biased at different currents and current densities. This is especially advantageous when the semiconductor is subject to local defects such as crystal dislocations, pitting, voids, etc. Such defects in the epitaxial growth can be a point of lower electrical resistance than the surrounding epitaxial areas. The higher electrical current flowing through these points of lower electrical resistance creates "hot spots" which cause non-uniform gain in the effected areas. It is desirable to have uniform gain along the entire length of the SOA, or to be able to tailor the gain to be high in the center of the SOA with lower gain near the edges to minimize degradation, or to tailor other gain profiles to adjust to input signal requirements. In addition to the less than optimal performance resulting form the non-uniform gain, the "hot spots" are source of premature device failure. By suitably adjusting the separate current source for such an area, these limitations can be substantially mitigated.

Additionally, the use of separate electrical bias currents for the different transverse lasing cavities provides an ability to fine-tune the overall gain curve of the SOA versus wavelength. As known in the art, when biased to different current levels above threshold, the gain characteristic of the gain medium versus wavelength will shift laterally and/or will change in bandwidth or shape. When there are many transverse laser cavities, this effect may be used to change the overall gain characteristic versus wavelength, because the overall gain characteristic versus wavelength will comprise the weighted sum of the gain curves of the transverse laser cavities (minus the weighted losses of the connecting zones).

By way of further example, the use of separate electrical bias currents for the different transverse lasing cavities allows a single, integrated device to contain a plurality of functionally separate optical devices connected in series to achieve a desired goal. One such goal, for example, may be to achieve a high-speed integrated return-to-zero (RZ) optical modulator, such devices becoming increasingly desired for use in long-haul fiber optic links. As discussed in Ougazzaden, "40 Gb/s Tandem Electro-Absorption Modulator," Optical Fiber Communication Conference and Exhibit, pp. PD14-1 to PD14-3, Optical Society of America, Anaheim, Calif. (Mar. 17–22, 2001), such a device may require an integrated serial combination of a first electro-absorption modulator (EAM) for "carving" a series of RZ pulses into an optical carrier, a conventional SOA for amplifying the result, and a second EAM for encoding a binary data stream onto the RZ pulse stream. Advantageously, an SOA in accordance with the preferred embodiments may be readily adapted to achieve such functionality. In particular, a first set of electrical contacts are biased in an active, linear region of operation with a varying current such that an input carrier wave is modulated into a stream of optical RZ pulses, thereby achieving the functionality of the first EAM. A second set of contacts are biased at a fixed current to achieve the conventional SOA portion. A third set of electrical contacts are biased in a binary manner between "on" and "dark" levels corresponding to an input data stream, thereby achieving the second EAM. Optionally and advantageously, however, the functionality of the first and second set of contacts (EAM/SOA), i.e. the functions of variable attenuation followed by amplification, may be unified into a single set of contacts in which the RZ pulses are formed by variable amplification, or by a combination of variable attenuation and amplification, thereby simplifying the design and operation of the overall device.

As a further example, in a fabrication scenario similar to one common with high-density computer memories, each transverse laser cavity might be provided with one or more fusible links during the fabrication phase. During a post-fabrication testing phase, if one of the transverse laser cavities has an unacceptable hot-spot, one of the fusible links for that transverse laser cavity may be opened, thereby disabling that transverse laser cavity such that it operates only in transparency mode, but retaining the usability of the device as a whole.

Individual current control can also allow special effects such as taking one or more of the laser cavities below lasing threshold. This lowers and unclamps the transverse laser operation resulting in non-linear gain effects along the signal path. A possible use for this mode might be to tailor the output response in specific ways. Potentially, amplified spontaneous emission (ASE) noise might be reduced due to the presence of multiple smaller transverse laser cavities as opposed to the use of fewer larger cavities. As another example, back-transmission into the source (due to reflections, for example) might be reduced by decreasing the gain of the first transverse laser cavity encountered by the optical signal, or the first several cavities.

The structures described here can be inverted, e.g., n-i-p instead of the p-i-n structures shown, if a p-InP substrate is used. Also, either p-i-n or n-i-p structures can be fabricated using a semi-insulating InP substrate. In addition, n-i-p structures can be fabricated on n-InP substrate by use of a tunnel junction. While certain preferred embodiments have been described in terms of an InGaAsP/InP material system, other semiconductor compositions may also be used depending on the wavelength desired and other considerations without departing from the preferred embodiments. In addition, useful structures using wafer bonding can also be fabricated. In this case, the guiding waveguide can be bonded onto an active layer. Other possibilities include using dielectric or polymer waveguides on active layers.

Figure 9:
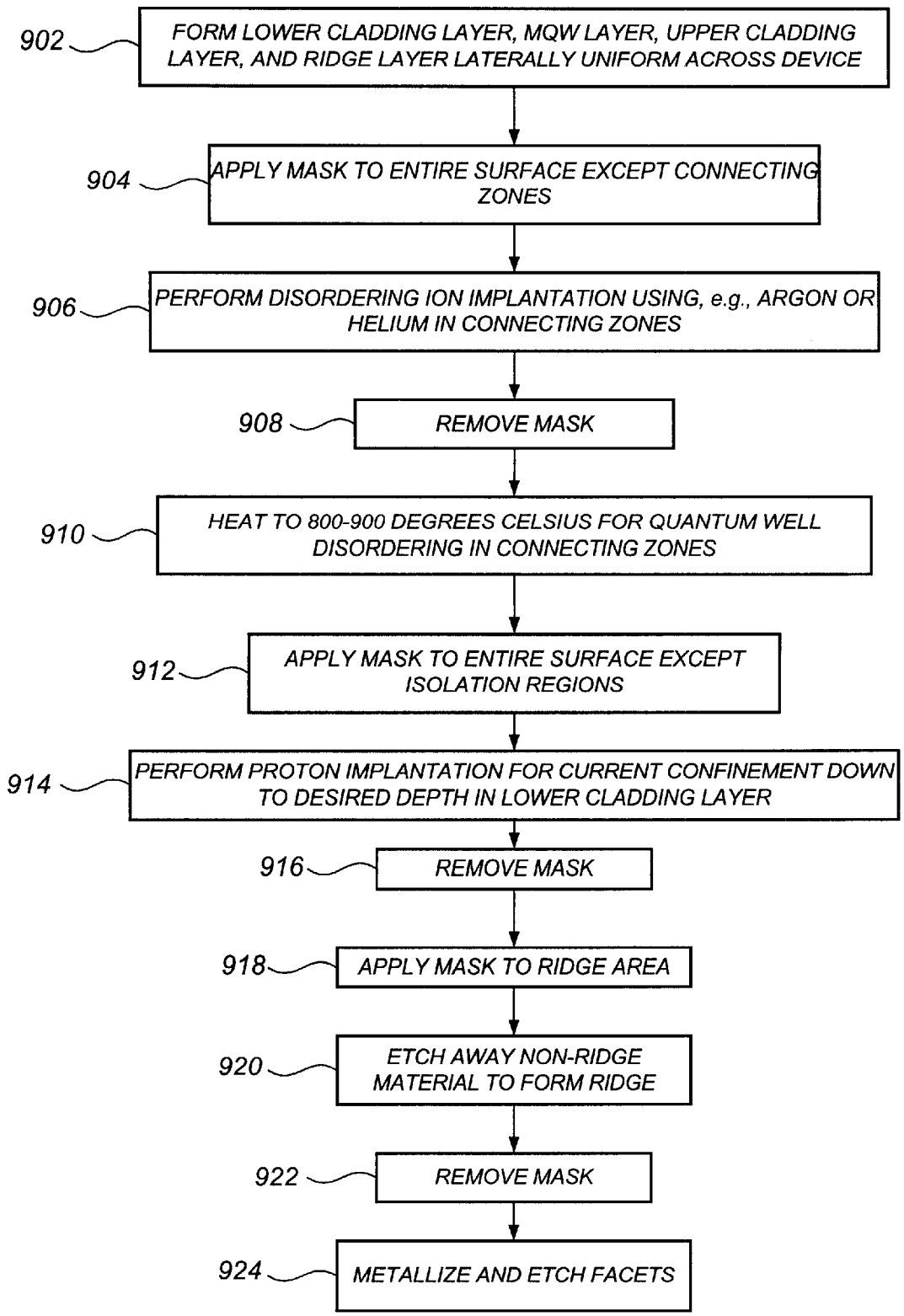
FIG. 9 illustrates steps for fabricating an SOA in accordance with a preferred embodiment.

FIG. 9 illustrates steps for fabricating an SOA in accordance with a preferred embodiment. Advantageously, a substantial portion of the fabrication process may be performed using growth and fabrication techniques similar to those used for conventional 1300–1550 nm edge emitting lasers, this technology being relatively mature and providing good device yields and good device reliability. At step 902, the lower cladding layer, multi-quantum well layers, upper cladding layer, and ridge layers are formed using known methods, such that they are laterally uniform across the device. At this point, an actual ridge feature does not yet exist above the upper cladding layer. However, the ridge feature will be formed from the ridge layer material positioned above the upper cladding layer. At step 904, a mask (e.g., a gold mask) is applied to the entire surface except for the connecting zones (see, e.g., elements 212 of FIG. 2). Thus, only the connecting zones are exposed. At step 906, a disordering ion implantation is performed, e.g., using argon or helium. At step 908 the mask is removed. At step 910, the wafer is heated to 800–900 degrees Celsius momentarily to achieve quantum well disordering in the connecting zones.

At step 912, a mask is applied to the entire surface except for the isolation regions (see, e.g., elements 130 of FIG. 1 or areas 204 of FIG. 2, which includes areas 212 and 214.) Thus, the isolation regions are exposed. At step 914, a proton implantation is performed down to a desired depth $d_{IM}$ from the top surface, usually extending into the lower cladding layer, for current confinement. At step 916, the mask is again removed.

At step 918, a mask is applied to the ridge area, i.e., the area covered by the ridge feature 116 of FIG. 1. At step 920, non-ridge material is etched away such that the ridge 116 is formed. At step 922, the mask is removed. Forming the ridge 116 subsequent to the current-confining ion implantation, and not before the current-confining ion implantation, assists in ensuring a consistent ion implantation depth across the width of the device. It is to be appreciated that the ridge feature 116 may have sides with a profile other than vertical, e.g., the sides might have a sloped profile, rounded profile, or other profile. At step 924, the etching of facets and metallization steps are carried out using known methods.

A variety of variations on the above steps may be used in accordance with the preferred embodiments to achieve the desired structures. For example, to fabricate the SOA of FIG. 6 in which the connecting zone gain medium is to be biased, the disordering steps 904–910 are skipped, and the steps 912–914 are performed a first time for the connecting zones (see, e.g., areas 212 of FIG. 2) and a second time for the outer portions of the isolation region 130 (see, e.g., areas 214 of FIG. 2). Separate implantation of the areas 212 and 214 allows for a custom resistive profile to be applied to the area 212 as discussed supra with respect to FIG. 6. As an additional example, different orderings of the steps of FIG. 9 may accommodate different processing to achieve the desired structures, including, but not limited to: oxygen implantation, selective thermal disordering using laser beams, helium implantation, carrier-compensating implants, argon or silicon disordering implants, vacancy enhanced disordering, and other processing steps.

Figure 10:
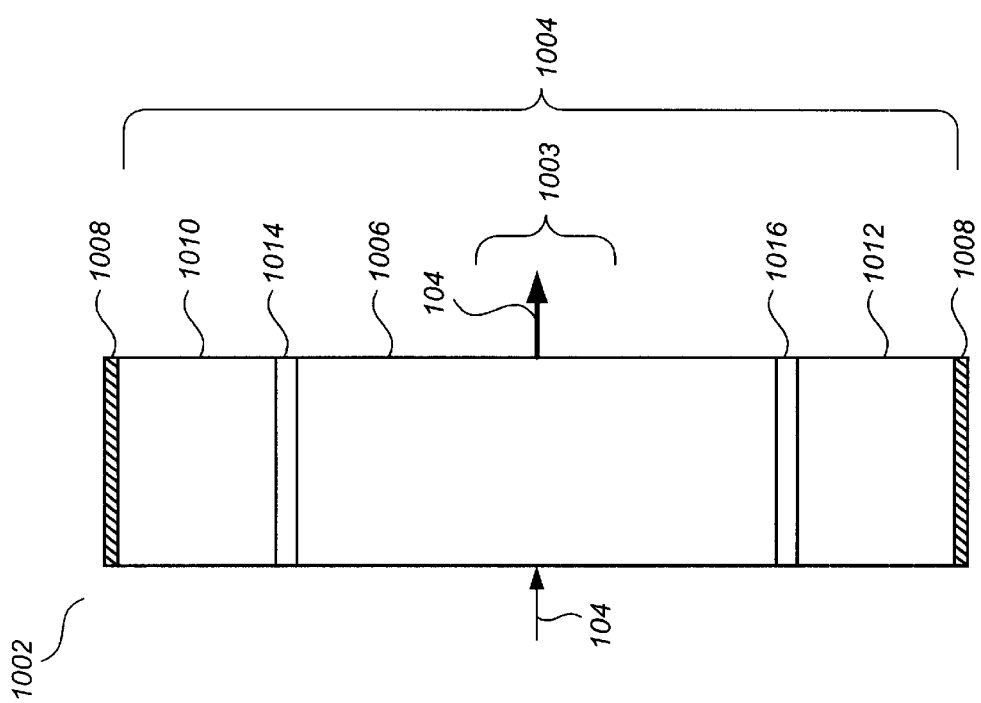
FIG. 10 illustrates an SOA with a multi-contact transverse laser cavity in accordance with a preferred embodiment.

FIG. 10 illustrates an SOA 1002 in accordance with a preferred embodiment, comprising a single multi-contact transverse laser cavity 1004 having a gain medium coincident with the gain medium along a signal waveguide 1003. A ridge element (not shown) provides for lateral confinement of the optical signal 104 as it propagates from an input to an output (left to right in FIG. 10), and antireflective coatings (not shown) are also provided at the input and output. The multi-contact transverse laser cavity 1004 is formed between end mirrors 1008, and has a vertical material profile similar to the vertical material profile of the transverse laser cavities 118 of FIG. 1, supra. However, the multi-contact transverse laser cavity 1004 is segmented in the direction of the lasing field (top to bottom in FIG. 10) into a center segment 1006 and end segments 1010 and 1012. The end segments 1010 and 1012 are separately biased with respect to the center segment 1006. The end segments 1010 and 1012 may be biased from the same current source, or alternatively may be biased from separate current sources provided that they are biased separately from the center segment 1006. The end segments 1010 and 1012 are spatially separated from the center segment 1006 by electrical isolation regions 1014 and 1016, respectively. The electrical isolation regions 1014 and 1016 are preferably ion-implanted and disordered, such that they form an electrical barrier but not an optical barrier. Accordingly, the electrical isolation regions 1014 and 1016 are similar in structure and fabrication to the connecting zones lying along the signal path between adjacent transverse laser cavity portions in the preferred embodiment of FIG. 1, supra. This allows the segments 1006, 1010, and 1012 to be separately biased and yet be part of the same lasing cavity.

According to a preferred embodiment, the SOA 1002 may be operated in a first configuration and a second configuration according to the bias currents provided to the end segments 1010 and 1012. The SOA 1002 may permanently remain in either of the first or second configurations, or alternatively may be switched back and forth between the first and second configurations. In the first configuration, the end segments are provided with no bias current or negligible bias current. In this "dark" or "off" configuration, gain clamping is impeded in the multi-contact transverse laser cavity 1004. This causes the unclamped gain medium along the signal path 1003 to have a lower saturation power and a slower gain recovery time, generally causing the SOA 1002 to amplify the optical signal 104 in a nonlinear manner. In a second configuration, the end segments are provided with bias currents sufficient to facilitate gain clamping in the multi-contact transverse laser cavity 1004. The clamped gain medium along the signal path 1003 provides for higher saturation power and faster gain recovery time, generally causing the SOA 1002 to amplify the optical signal 104 in a linear manner. As mentioned supra with respect to the preferred embodiment of FIG. 8, there are a variety of uses for amplification devices that can be taken in and out of nonlinear operation.

Figure 11:
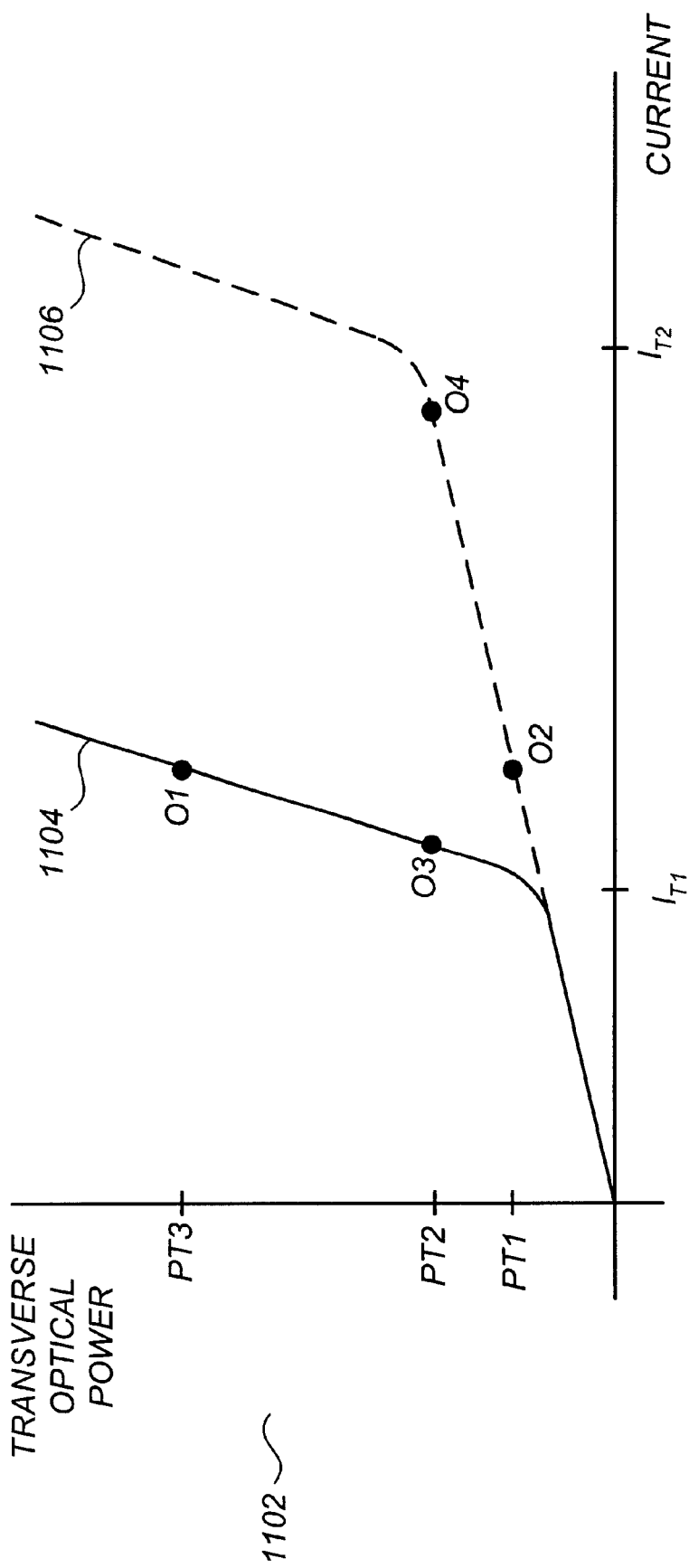
FIG. 11 illustrates a conceptual plot of output light versus center segment current for the transverse laser cavity of FIG. 10.

FIG. 11 illustrates a conceptual plot of transverse optical power generated by the multi-contact transverse laser cavity 1004 of FIG. 10 versus bias current supplied to the center segment 1006, for both "on" and "off" modes of the end segments 1010 and 1012. In particular, when the end segments 1010 and 1012 are "on," the curve 1104 (solid line) represents the operation of the multi-contact transverse laser cavity 1004, while the curve 1106 (dotted line) represents the operation of the multi-contact transverse laser cavity 1004 when the end segments 1010 and 1012 are "dark" or "off." It is to be appreciated that the plots 1104 and 1106 are conceptual in nature for clearly describing the features and advantages of the preferred embodiments, and are not necessarily to scale.

As indicated in FIG. 11, in the "on" or "linear" state the curve 1104 is similar to a standard light-current or "L-I" curve for a laser. If the current is less than a threshold current $I_{T1}$, operation is unclamped, whereas the laser becomes gain-clamped at bias currents above $I_{T1}$. According to a preferred embodiment, the bias current to the center segment 1006 is set above $I_{T1}$ during the "on" state, such that the multi-contact transverse laser cavity 1004 operates at "linear" points such as O1 or O3 on the curve 1104.

However, for the "off" or "dark" state the curve 1106 is significantly shifted up and to the right, signifying that lasing/gain clamping action is impeded. Only when the end segments become "bleached" above a very high threshold current $I_{T2}$ would gain-clamped operation be achieved. According to a preferred embodiment, the bias current to the center segment 1006 is set below $I_{T2}$ during the "off" state, such that the multi-contact transverse laser cavity 1004 operates at "nonlinear" points such as O2 or O4 on the curve 1104.

Figure 12:
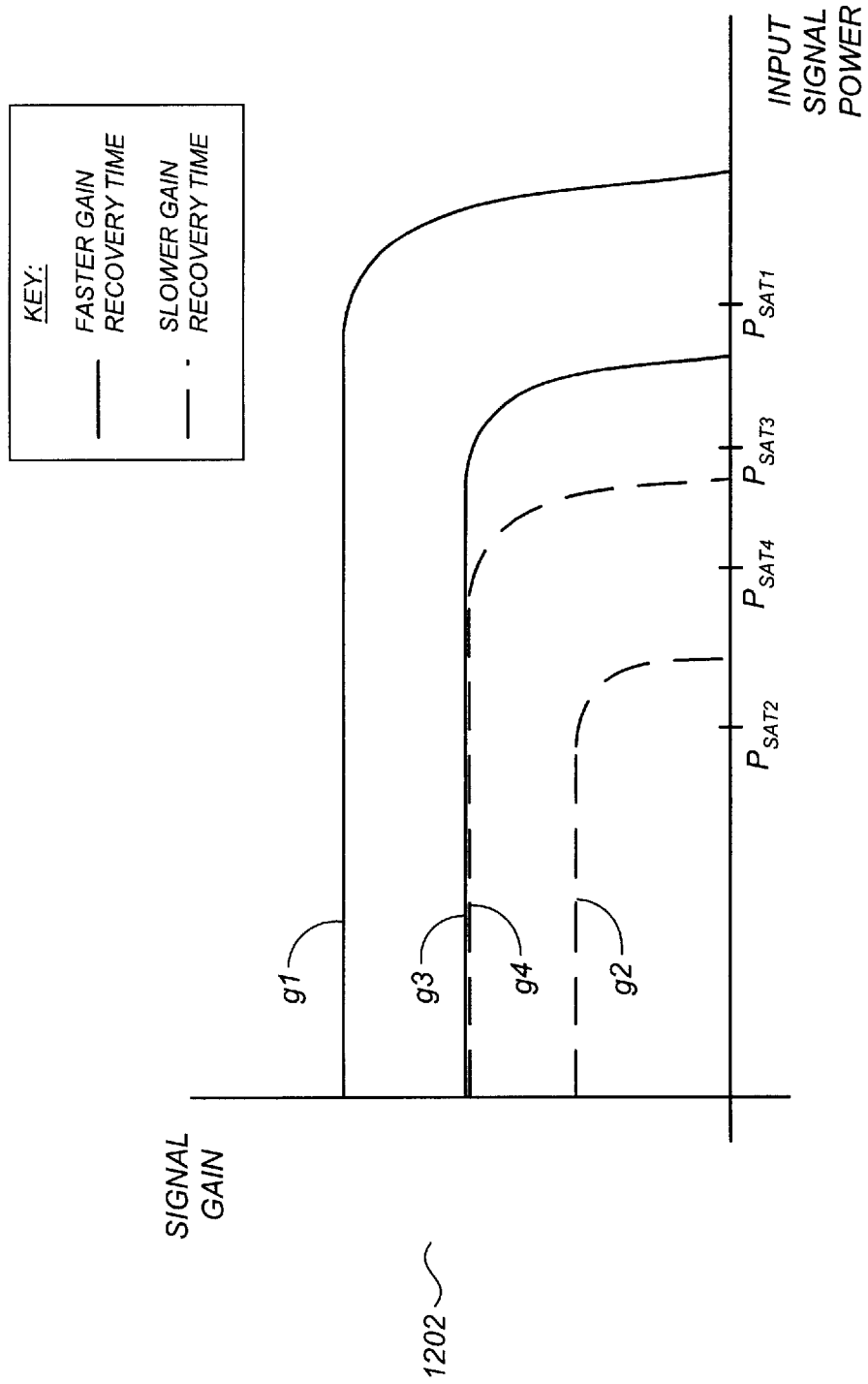
FIG. 12 illustrates a conceptual plot of signal gain versus input signal power for the SOA of FIG. 10.

FIG. 12 illustrates conceptual plots g1, g2, g3, and g4 of signal gain versus input optical power along the signal path 1003 corresponding to the different operation points O1, O2, O3, and O4, respectively, for the SOA 1002. For linear operation point O1, the curve g1 shows a high gain value that stays relatively constant for all input power levels up to a saturation power $P_{SAT1}$. For the linear operation point O3, the curve g3 shows similar gain values, because the multi-contact transverse laser cavity 1004 is gain-clamped above threshold also. Also, the saturation power $P_{SAT3}$ is reduced as compared to the saturation power $P_{SAT1}$ because of the lower gain-clamping level. Still, for both of the curves g1 and g3, the operation is considered linear because the multi-contact transverse laser cavity 1004 is indeed gain clamped. As indicated by the solid lines for g1 and g3 in FIG. 12, the gain recovery time is very brief due to the gain-clamped operation of the transverse laser cavity.

For the nonlinear operation point O4, the curve g4 generally shows similar signal gain for low power levels as compared to the linear O2. This is because there is generally a similar amount of population inversion in the gain medium, although a substantially greater amount of current (see FIG. 11) is needed for this point. However, because the transverse laser cavity is unclamped at the operating point O4, the gain recovery time is substantially more sluggish, resulting generally in nonlinear operation. Also, the saturation power $P_{SAT4}$ is substantially less than the saturation power $P_{SAT3}$ due to the absence of gain-clamping in the gain medium. For the nonlinear operation point O2, the curve g2 shows an even lesser gain for low power levels, and an even smaller saturation power $P_{SAT2}$.

Figure 13:
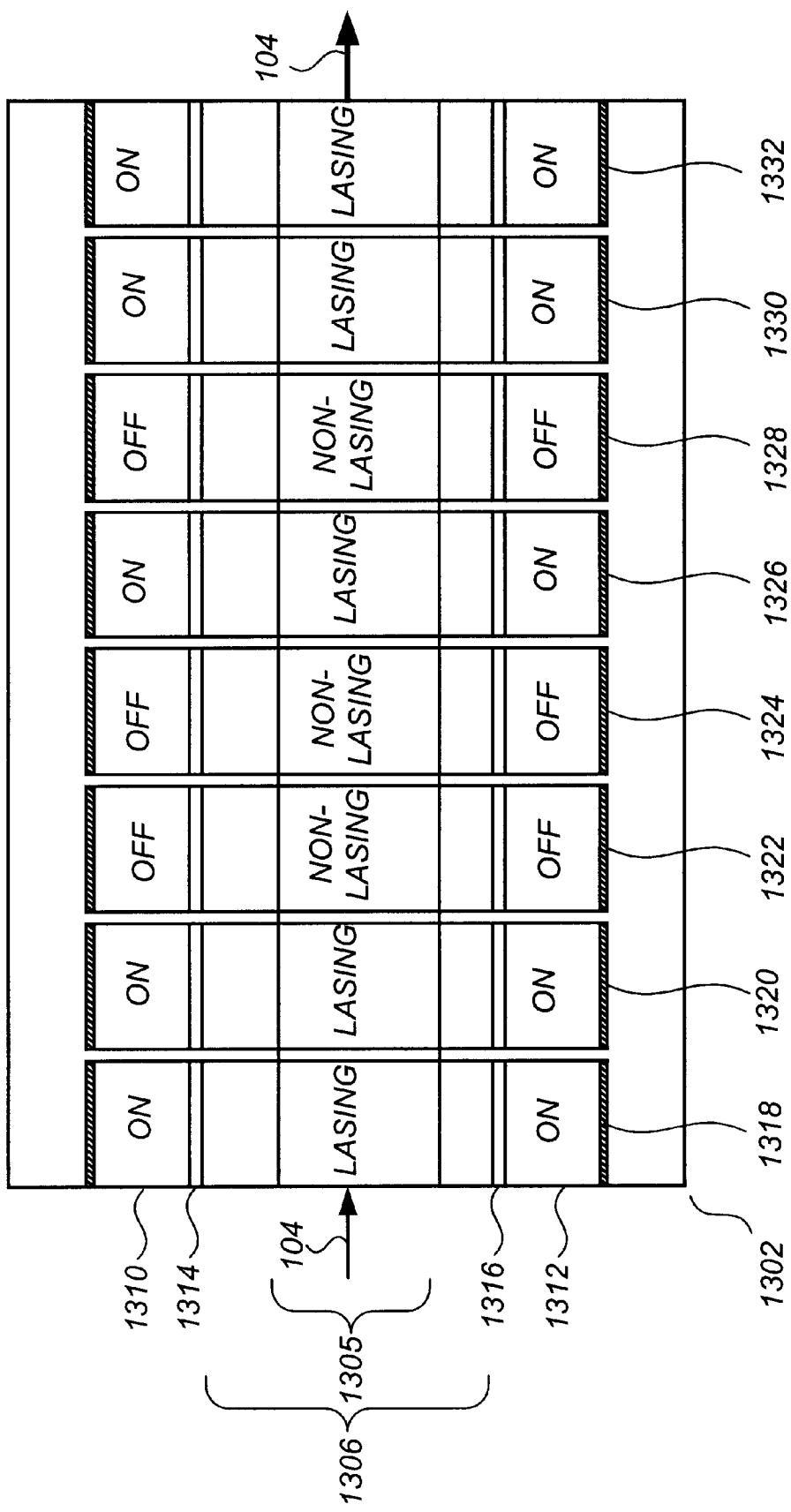
FIG. 13 illustrates an SOA with a plurality of multi-contact transverse laser cavities in accordance with a preferred embodiment.

FIG. 13 illustrates an SOA 1302 having a plurality of multi-contact transverse laser cavities 1318–1332 in accordance with a preferred embodiment. Each of the multi-contact transverse laser cavities 1320–1332 is similar to the multi-contact transverse laser cavity 1318, which comprises end segments 1310 and 1312 similar to the end segments 1010 and 1012 of FIG. 10, a center segment 1306 similar to center segments 1006 of FIG. 10, and electrical isolation regions 1314 and 1316 similar to the electrical isolation regions 1014 and 1016 of FIG. 10. However, in other preferred embodiments the multi-contact transverse laser cavities 1318–1332 may be different from each other. FIG. 13 also shows a center ridge 1305 along which the optical signal 104 is guided. According to a preferred embodiment, a first set of multi-contact transverse laser cavities (e.g., 1318, 1320, 1326, 1330, and 1332) may have end segments that are turned "on" for a linear gain profile, while a second set of multi-contact transverse laser cavities (e.g., 1322, 1324, and 1328) may have end segments that are turned "off" for a nonlinear gain profile. The arrangement of "on" and "off" cavities may be fixed during operation, or alternatively may be dynamically altered or modulated with external signals to achieve the desired signal processing operation. The SOA 1302 represents a dynamically adjustable, multi-purpose optical signal processing device that allows linear amplification along a first set of longitudinal segments and nonlinear amplification along a second set of longitudinal segments. Applications for such a multi-purpose device may be found, for example, in the fields of optical gating, wavelength conversion, or optical signal regeneration.

Figure 14:
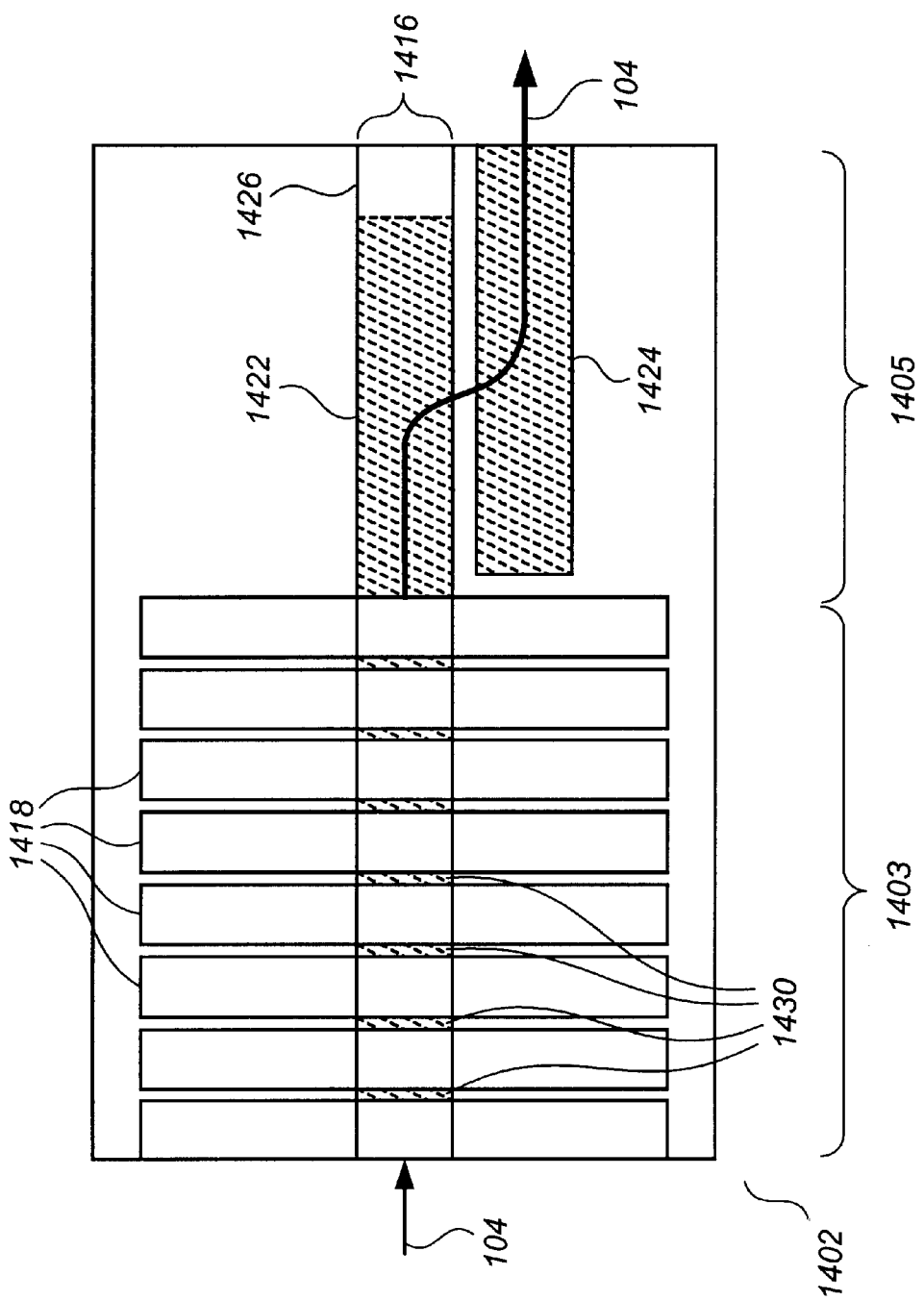
FIG. 14 illustrates a simplified top view of an SOA having reduced amplified spontaneous emission (ASE) in its output in accordance with a preferred embodiment.

According to an alternative preferred embodiment, an SOA similar to the SOA 1302 of FIG. 13 is provided, wherein all of the transverse laser cavities are turned "on" to achieve gain-clamped operation, but the device is configured to have a negative overall gain. This is achieved by ensuring that the positive gain along the signal path at intersections with the transverse lasers is overcome by the attenuation experienced in the connecting zones lying between the transverse lasers. In another preferred embodiment, this overall negative gain can be dynamically adjustable, thereby allowing the SOA device to operate as a variable optical attenuator (VOA). This can be useful in signal equalization applications, wherein an array of such SOAs is provided and each SOA adjustably attenuates a different optical signal. In still another preferred embodiment, one or more of the transverse lasers of the SOA can be taken below its threshold current, either statically or dynamically, to cause the SOA to become a nonlinear negative-gain device FIG. 14 illustrates a simplified top view of an SOA 1402 having reduced amplified spontaneous emission (ASE) in its output in accordance with a preferred embodiment. In a first section 1403, the SOA 1402 is similar to the SOA 102 of FIG. 1, comprising a plurality of transverse laser cavities 1418, as well as a ridge element 1416 for lateral confinement of the optical signal 104. Also shown in FIG. 14 are connecting zones 1430 that are shaded to indicate that the quantum well layer is disordered in those zones. Integrated into the same semiconductor structure is a second section 1405, comprising a waveguide extension 1422 and an auxiliary waveguide 1424. The waveguide extension 1422 and auxiliary waveguide 1424 are configured and dimensioned to form a resonant coupler such that the optical signal 104 is transferred to the auxiliary waveguide 1424 prior to output. The ASE generated along the first section 1403 does not couple effectively into the auxiliary waveguide 1424, and ASE in the output is thereby reduced. The ridge element 1416 extends into the waveguide extension 1422 for lateral confinement, and auxiliary waveguide 1424 comprises its own separate ridge element. Importantly, the quantum well layer lying beneath the waveguide extension 1422 and auxiliary waveguide 1424 is disordered to reduce losses in the optical signal 104. By way of example and not by way of limitation, the second section 1405 may add approximately 1000 $\mu$m to the overall length of the device, and the waveguide extension 1422 and auxiliary waveguide 1424 may be separated by about 5 $\mu$m. Preferably, because of the close lateral spacing of these waveguides near the output, a section 1426 in which the quantum well is not disordered is provided at the end of the waveguide extension 1422. This inhibits ASE from entering a pigtail or other optical device that receives the output signal 104, and also reduces reflections back into the source.

While the example of FIG. 14 shows horizontal coupling into an auxiliary waveguide for ASE reduction, in another preferred embodiment vertical coupling may be used. Examples of vertical coupling structures and/or other horizontal coupling structures are discussed in: Liu et. al., "Optical Add/Drop Multiplexers Based on X-Crossing Vertical Coupler Filters," IEEE Photonics Technology Letters, Vol. 12, No. 4 (April 2000); Kawano et. al., "4×4 InGaAlAs/InAlAs MQW Directional Coupler Waveguide Switch Modules Integrated with Spot-Size Converters and Their 10 Gb/s Operation," Electronics Letters, Vol. 31, No. 2 (Jan. 19, 1995); Francois et. al., "Horizontal Directional Coupler Filter Suitable for Integration in a 1.3+/1.3– Duplexer," Electronics Letters, Vol. 31, No. 23 (Nov. 9, 1995); Dollinger et. al., "Ultrashort Low-Loss Optical Multiquantum-well GaAs/GaAlAs Vertical Directional Coupler Switch," Electronics Letters, Vol. 32, No. 16 (Aug. 1, 1995); and Shibata et. al., "Semiconductor Monolithic Wavelength Selective Router Using Grating Switch with Directional Coupler," Electronics Letters, Vol. 31, No. 12 (Jun. 8, 1995), each of which is incorporated by reference herein. Optionally, a tunable coupling configuration between the waveguides can be used, wherein the degree of coupling between the waveguides can be controlled or modulated by electrical signals, mechanical signals, optical signals, or other signals. Other filtering mechanisms such as those incorporating fiber Bragg gratings may also be used to filter out the ASE.

Figure 15:
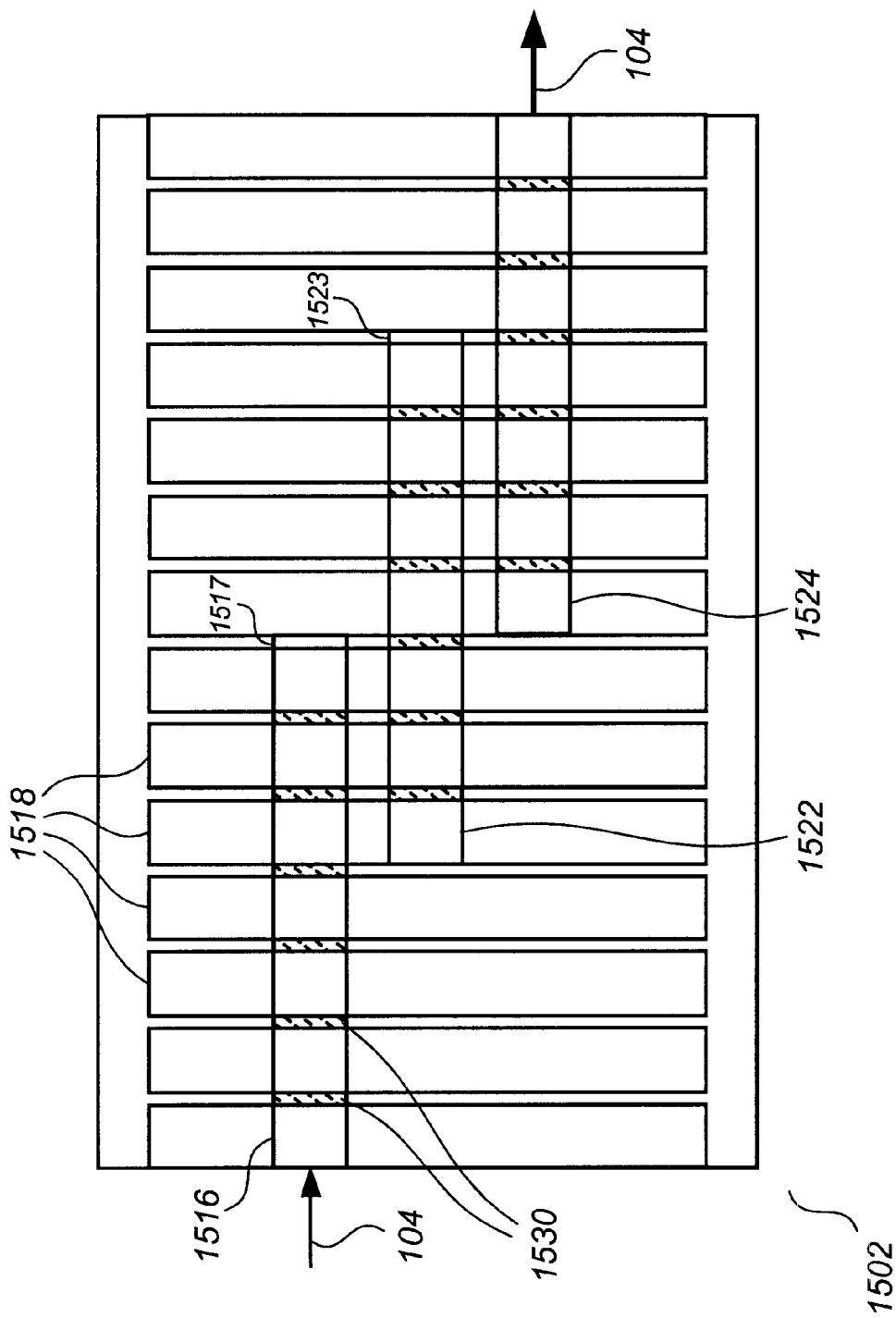
FIG. 15 illustrates a simplified top view of an SOA having reduced ASE in its output in accordance with a preferred embodiment.

FIG. 15 illustrates a simplified top view of an SOA 1502 having reduced amplified spontaneous emission (ASE) in its output in accordance with a preferred embodiment. In this embodiment, resonant coupling occurs simultaneously with signal gain rather than after signal gain. SOA 1502 comprises a plurality of transverse laser cavities 1518 that intersect signal waveguides 1516, 1522, and 1524, which in turn are resonantly coupled such that the optical signal 104 is received at signal waveguide 1516, is transferred to signal waveguide 1522, and then transferred to signal waveguide 1524 prior to output, all the while being amplified by the gain medium excited by the transverse lasing fields. As indicated in FIG. 15, the connecting zones 1530 along each signal waveguide between transverse laser cavities are disordered, except for and end connecting zone 1517 of signal waveguide 1516 and end connecting zone 1523 of signal waveguide 1522. The end connecting zones 1517 and 1523 are not disordered, thereby reducing reflections back into the source and inhibiting ASE produced along signal waveguides 1516 and 1522 from finding its way into the pigtail or other optical device that receives the output signal 104. Although some ASE produced along signal waveguide 1524 may be present in the output, this amount is usually less than the total ASE that would otherwise be present in the output without the filtering approach of FIG. 15. Vertical coupling between the successive signal waveguides may be used in alternative preferred embodiments. Also, tunable coupling configurations between the waveguides may optionally be implemented such that the degree of coupling can be controlled by electrical, optical, mechanical, or other types of signals. Finally, other filtering mechanisms such as those incorporating fiber Bragg gratings may be used.

It is to be appreciated that the multiple transverse lasers used to excite the gain medium of a semiconductor optical amplifier are not necessarily required to be of the edge-emitting type. According to another preferred embodiment, the transverse lasers are vertical cavity surface emitting lasers (VCSELs) comprising a gain medium layer lying between distributed Bragg reflectors (DBRs). The multiple VCSELs are placed in an array, such as a linear array, such that their gain medium layers define a signal path between a first VCSEL and an Nth VCSEL, with connecting zones running between successive VCSELs. The optical signal being amplified travels along the gain medium layers between the DBRs in a direction transverse to the lasing field, which is vertically oriented. The connecting zones running between adjacent VCSELs along the signal path preferably have disordered quantum well layers to reduce attenuation. Accordingly, by using multiple transverse VCSELs separated by connecting zones to excite the SOA gain medium according to a preferred embodiment, a significant amount of overall gain can be achieved even though the gain medium volume of each transverse VCSEL may be small.

Whereas many alterations and modifications of the present invention will no doubt become apparent to a person of ordinary skill in the art after having read the foregoing description, it is to be understood that the particular embodiments shown and described by way of illustration are in no way intended to be considered limiting. By way of example, while the preferred embodiments supra are described in terms of a signal gain medium that is electrically pumped by a transverse laser cavity, it would be within the scope of the preferred embodiments to optically pump the signal gain medium using light emitted by a transverse-mounted laser. In such preferred embodiment, the operating wavelength of the transverse laser would be less than the operating wavelength of the signal gain medium, so that photons absorbed by the signal gain medium would have sufficient energy to excite the atoms of the signal gain medium. By way of further example, in an alternative preferred embodiment the entire length of the isolating region 130 may be disordered, including the outer portions away from the connecting zone. The device is still operative, as there is still electrical isolation between adjacent transverse laser cavities and gain confinement, but fabrication is made easier. Therefore, reference to the details of the preferred embodiments are not intended to limit their scope, which is limited only by the scope of the claims set forth below.

What is claimed is:

1. A semiconductor optical amplifier, comprising:
  a signal waveguide positioned along a signal path, said signal waveguide comprising a signal gain medium for providing amplification to an optical signal propagating along the signal waveguide;
  a plurality of transverse laser cavity portions, said transverse laser cavity portions being non-overlapping with each other, each transverse laser cavity portion comprising a laser gain medium, each transverse laser cavity portion intersecting said signal waveguide at a region of intersection, wherein said laser gain medium of each transverse laser cavity portion is at least partially integral with said signal gain medium within said region of intersection; and
  a plurality of connecting zones integral with said signal waveguide and running between said regions of intersection, said optical signal alternately passing through said connecting zones and said regions of intersection along said signal path;
  wherein said signal waveguide comprises at least one layer having a greater electrical resistivity in said connecting zones than in said regions of intersection;
  whereby said transverse laser cavity portions are at least partially electrically isolated from each other along said regions of intersection with said signal waveguide.

2. The semiconductor optical amplifier of claim 1, wherein said at least one layer of said signal waveguide includes a cladding layer.

3. The semiconductor optical amplifier of claim 1, wherein said transverse laser cavity portions are substantially perpendicular to said signal waveguide.

4. The semiconductor optical amplifier of claim 1, wherein said transverse laser cavity portions are oriented at an angle with respect to said signal waveguide corresponding to a Brewster angle.

5. The semiconductor optical amplifier of claim 1, wherein said transverse laser cavity portions are reflectively coupled at their respective ends to form a folded-path laser, wherein said folded-path laser achieves clamped-gain operation when pumped with an electrical current above a threshold current.

6. The semiconductor optical amplifier of claim 5, wherein said transverse laser cavity portions are reflectively coupled by free-space trenches formed at said respective ends.

7. The semiconductor optical amplifier of claim 5, said folded-path laser comprising a first end mirror and a second end mirror, said first end mirror being positioned at an end of a first transverse laser cavity portion near an input of said signal waveguide, said second end mirror being positioned at an end of a second transverse laser cavity portion near an output of said signal waveguide, said folded-path laser being biased by a single bias current provided at a single upper electrical contact thereof.

8. The semiconductor optical amplifier of claim 5, said folded-path laser comprising a first end mirror and a second end mirror, said first end mirror being positioned at an end of a first transverse laser cavity portion near an input of said signal waveguide, said second end mirror being positioned at an end of a second transverse laser cavity portion near an output of said signal waveguide, said folded-path laser comprising a plurality of upper electrical contacts for receiving a plurality of distinct bias currents, whereby separate areas of said laser gain medium of said folded-path laser may be biased at different currents and current density levels.

9. The semiconductor optical amplifier of claim 5, wherein said signal waveguide is configured and dimensioned to propagate light in a single mode along said signal path.

10. The semiconductor optical amplifier of claim 1, wherein each of said transverse laser cavity portions is a distinct transverse laser, each transverse laser having a set of end mirrors and an electrical contact for receiving a bias current.

11. The semiconductor optical amplifier of claim 10, wherein said signal gain medium of said signal waveguide is disordered in said connecting zones.

12. The semiconductor optical amplifier of claim 10, wherein each of said transverse lasers receives a bias current from a distinct current source, whereby different transverse lasers may be biased at different currents and current density levels.

13. The semiconductor optical amplifier of claim 10, said transverse laser being substantially parallel to each other, said semiconductor optical amplifier further comprising at least one implanted region for forming a boundary between successive transverse lasers, said implanted regions coinciding with said connecting zones when intersecting said signal waveguide.

14. The semiconductor optical amplifier of claim 13, wherein each of said transverse lasers is gain-guided.

15. The semiconductor optical amplifier of claim 10, each transverse laser having a length corresponding to a distance between said end mirrors, each transverse laser having a width corresponding to a distance along said optical path for which said transverse laser is intersecting with said signal waveguide, wherein each of said transverse lasers has a length to width ratio that is greater than 5:1.

16. The semiconductor optical amplifier of claim 15, wherein said signal waveguide is configured and dimensioned to propagate light in a single mode along said signal path, and wherein each transverse laser has a length between 30 $\mu$m and 50 $\mu$m, inclusive.

17. The semiconductor optical amplifier of claim 15, wherein said mirrors of each of said transverse lasers are etched-facet mirrors, and wherein each of said transverse lasers has a cavity length between 15 $\mu$m and 30 $\mu$m, inclusive.

18. The semiconductor optical amplifier of claim 2, said transverse laser cavity portions each comprising an electrical contact for receiving a bias current, wherein said cladding layer of said signal waveguide in said connecting zones material has a resistivity profile such that said signal gain medium in said connecting zones is biased to transparency by current supplied from said electrical contacts of said transverse laser cavity portions, but such that said transverse laser cavity portions remain substantially electrically isolated from each other.

19. An apparatus, comprising:
  a signal waveguide for guiding an optical signal a first distance in a first direction; and
  a plurality of laser cavity portions, said laser cavity portions being non-overlapping with each other, each laser cavity portion accommodating a lasing field oriented in a second direction not parallel to said first direction, each laser cavity portion comprising a laser gain medium, each laser cavity portion having a lateral intersection with said signal waveguide such that its laser gain medium lies within an upper and a lower boundary of said signal waveguide at said lateral intersection, thereby forming a region of amplification corresponding to said lateral intersection;

wherein the optical signal traveling in said first direction is amplified upon encountering said regions of amplification, said regions of amplification occupying a first percentage of said first distance;

wherein the optical signal traveling in said first direction experiences losses upon encountering at least one passive segment lying between said regions of amplification, said passive segments not having an activated gain medium, said passive segments occupying a remainder of said first distance not occupied by said regions of amplification; and wherein said first percentage is sufficient to cause positive amplification of said optical signal as it propagates over said first distance.

20. The apparatus of claim 19, wherein said signal waveguide comprises a cladding layer having an electrical resistivity that is greater in said passive segments than in said regions of amplification.

21. The apparatus of claim 20, wherein said laser cavities are substantially electrically isolated from each other across said passive segments.

22. The apparatus of claim 19, wherein said first direction is substantially perpendicular to said second direction.

23. The apparatus of claim 19, wherein said first direction is separated from said second direction by a Brewster angle.

24. The apparatus of claim 19, wherein said laser cavity portions are reflectively coupled at their respective ends to form a folded-path laser, wherein said folded-path laser achieves clamped-gain operation when biased with an electrical current above a threshold current.

25. The apparatus of claim 24, wherein said laser cavity portions are reflectively coupled by free-space trenches formed at said respective ends.

26. The apparatus of claim 24, said folded-path laser comprising end mirrors at laser cavity portions that intersect said signal waveguide near an input and an output thereof, respectively, said folded-path laser being biased by a single bias current provided at a single upper electrical contact thereof.

27. The apparatus of claim 24, said folded-path laser comprising end mirrors at laser cavity portions that intersect said signal waveguide near an input and an output thereof, respectively, said folded-path laser comprising a plurality of upper electrical contacts for receiving a plurality of distinct bias currents, whereby separate areas of said laser gain medium of said folded-path laser may be biased at different currents and current density levels.

28. The apparatus of claim 24, wherein said signal waveguide is configured and dimensioned to propagate light in a single mode along said signal path.

29. The apparatus of claim 19, wherein each of said plurality of laser cavity portions is a distinct transverse laser, each transverse laser having a set of end mirrors and an electrical contact for receiving a bias current.

30. The apparatus of claim 29, wherein each transverse laser receives a bias current from a distinct current source, whereby different transverse lasers may be biased at different currents and current density levels.

31. The apparatus of claim 29, each transverse laser having a length corresponding to a distance between said end mirrors along said second direction, each transverse laser cavity having a width corresponding to a distance along said first direction for which said transverse laser is intersecting with said signal waveguide, wherein each of said transverse lasers has a length to width ratio that is greater than 5:1.

32. The apparatus of claim 31, wherein said signal waveguide is configured and dimensioned to propagate light in a single mode along said signal path, and wherein the length of said transverse lasers is between 30 $\mu$m and 50 $\mu$m, inclusive.

33. The apparatus of claim 29, said transverse lasers being substantially parallel to each other, said apparatus further comprising at least one implanted region between successive transverse lasers, said implanted regions coinciding with said passive segments when intersecting said signal waveguide.

34. The apparatus of claim 33, wherein each of said transverse lasers is gain-guided.

35. The apparatus of claim 33, wherein said signal waveguide comprises a disordered quantum well portion in said passive segments.

36. The apparatus of claim 33, wherein said mirrors of each of said transverse lasers are etched-facet mirrors, and wherein each of said transverse lasers has a cavity length between 15 $\mu$m and 30 $\mu$m, inclusive.

37. A method of making a semiconductor optical amplifier having a signal waveguide and a plurality of transverse laser cavity portions intersecting the signal waveguide, the signal waveguide sharing a multi-quantum well (MQW) layer with the transverse laser cavity portions at intersections therewith, said method comprising:

forming a lower cladding layer;

forming the MQW layer;

forming an upper cladding layer;

disordering said MQW layer at a first set of locations, said first set of locations corresponding to areas of the signal waveguide running between successive intersections with the transverse laser cavity portions;

performing electrically isolating implants at a second set of locations corresponding to areas lying between successive transverse laser cavity portions along their lengths; and forming a lateral confinement ridge above said upper cladding layer.

38. The method of claim 37, wherein said electrically isolating implants penetrate said upper cladding layer, said MQW layer, and at least a portion of said lower cladding layer, thereby establishing electrical isolation between successive transverse laser cavity portions along their lengths.

39. The method of claim 38, further comprising forming a metallization layer at a third set of locations corresponding to said transverse laser cavity portions.

40. The method of claim 39, further comprising forming an intermediate ohmic contact layer between said upper cladding layer and said metallization layer at said third set of locations.

41. The method of claim 40, further comprising forming coupling mirrors between successive transverse laser cavity portions by etching diagonal trenches at their ends, such that at least one folded-path laser cavity is formed.

42. The method of claim 40, further comprising forming end mirrors on each transverse laser cavity portion by etching and depositing a highly reflective material at their ends.

43. A semiconductor optical amplifier, comprising:
 a signal waveguide positioned along a signal path, said signal waveguide comprising a signal gain medium for providing amplification to an optical signal propagating along the signal waveguide; and
 a plurality of transverse laser cavity portions, said transverse laser cavity portions being non-overlapping with each other, each transverse laser cavity portion comprising a laser gain medium, each transverse laser cavity portion intersecting said signal waveguide at a region of intersection, wherein said laser gain medium of each transverse laser cavity portion is at least partially integral with said signal gain medium within said region of intersection;
 wherein said signal gain medium of said signal waveguide is disordered at intermediate locations of said signal waveguide running between said regions of intersection.

44. The semiconductor optical amplifier of claim 43, wherein said signal waveguide comprises at least one layer having a greater electrical resistivity in said intermediate locations than in said regions of intersection, whereby said transverse laser cavity portions are at least partially electrically isolated from each other along said regions of intersection with said signal waveguide.

45. The semiconductor optical amplifier of claim 43, wherein each of said transverse laser cavity portions is a distinct transverse laser, each transverse laser having a set of end mirrors and an electrical contact for receiving a bias current.

46. The semiconductor optical amplifier of claim 45, said transverse lasers being substantially parallel to each other, said semiconductor optical amplifier further comprising at least one implanted region for forming a boundary between successive transverse lasers, said implanted regions coinciding with said intermediate locations when intersecting said signal waveguide.

47. An apparatus, comprising:
 a signal waveguide for guiding an optical signal in a first direction; and
 a plurality of distinct transverse lasers intersecting said signal waveguide at distinct regions of intersection, each transverse laser being oriented in a direction different than said first direction, each transverse laser comprising a gain medium that lies within said signal waveguide in its respective region of intersection such that the optical signal is amplified by the gain medium while propagating in the first direction;
 wherein each of said transverse lasers receives a separately controlled bias current for exciting its respective gain medium, such that different transverse lasers may cause different amounts of gain in the optical signal.

48. The apparatus of claim 47, wherein said transverse lasers are each biased at a current level above a lasing threshold to achieve gain-clamped operation, whereby gain-stabilized amplification of the optical signal is achieved in each of said regions of intersection.

49. The apparatus of claim 47, said signal waveguide having an input and an output, said plurality of distinct transverse lasers including a first transverse laser that intersects said signal waveguide near said input, wherein a majority of said transverse lasers are biased at a current level above a lasing threshold such that gain-clamped operation of the is achieved therein, but wherein said first transverse laser is biased below its lasing threshold, whereby reflections back toward said input are reduced.

50. A semiconductor optical amplifier, comprising:
 a signal waveguide extending in a first direction, said signal waveguide comprising a gain medium; and
 a first laser oriented in a second direction different than the first direction, said first laser intersecting the signal waveguide and having a gain medium integral with the gain medium of said signal waveguide at one or more points of intersection between the signal waveguide and the first laser, said first laser being segmented along said second direction into electrically isolated cavity segments including a first cavity segment and a second cavity segment, said first laser intersecting said signal waveguide along said first cavity segment, said first and second cavity segments being provided with separate bias currents;
 wherein gain clamped operation in said first cavity segment is impeded when said second cavity segment is provided with a first bias current below a predetermined current level, and wherein gain clamped operation in said first cavity segment is facilitated when said second cavity segment is provided with a second bias current above said predetermined current level.

51. The semiconductor optical amplifier of claim 50, said signal waveguide guiding and amplifying an optical signal along said first direction from an input to an output, said optical signal saturating said gain medium of said signal waveguide when said optical signal is greater than a saturation power, wherein said saturation power is equal to a first value when said second cavity segment is provided with said first bias current, wherein said saturation power is equal to a second value when said second cavity segment is provided with said second bias current, and wherein said second value is greater than said first value.

52. The semiconductor optical amplifier of claim 51, wherein said first and second cavity segments are electrically separated by an ion-implanted region.

53. The semiconductor optical amplifier of claim 52, wherein said ion-implanted region comprises a disordered quantum well, whereby said first and second cavity segments are substantially electrically isolated but not substantially optically isolated.

54. The semiconductor optical amplifier of claim 52, wherein the bias current provided to said second cavity segment is dynamically modulated between said first bias current and said second bias current, said optical signal being amplified with increased gain stability when the bias current provided to said second cavity segment is at said second bias current as compared to when the bias current provided to said second cavity segment is at said first bias current.

55. The semiconductor optical amplifier of claim 54, further comprising a second laser substantially identical to said first laser, said second laser being positioned adjacent to said first laser along said first direction and being parallel to said first laser, said second laser also intersecting the signal waveguide and having a gain medium integral with the gain medium of said signal waveguide at one or more points of intersection between the signal waveguide and the second laser, wherein said second cavity of said first laser is operated at said second bias current, and wherein a corresponding second cavity of said second laser is simultaneously operated at said first bias current, the optical signal experiencing linear, gain-stabilized amplification along a first portion of an optical path between the input and the output, the optical signal experiencing nonlinear, gain-instable amplification along a second portion of the optical path between the input and the output.

56. The apparatus of claim 55, wherein said first direction is substantially perpendicular to said second direction.

57. The apparatus of claim 55, wherein said first direction is separated from said second direction by a Brewster angle.

58. A semiconductor optical amplifier, comprising:
a signal waveguide extending in a first direction, said signal waveguide comprising a gain medium; and
a plurality of multi-segment transverse lasers oriented in a second direction different than the first direction, each multi-segment transverse laser intersecting said signal waveguide and sharing at least a portion of its gain medium with the gain medium of the signal waveguide, each multi-segment transverse laser comprising a first segment and a second segment electrically isolated from the first segment, said multi-segment transverse laser sharing its gain medium with the signal waveguide in said first segment, said first and second segments receiving distinct bias currents, wherein gain clamped operation in said first segment is facilitated when a bias current above a first threshold is provided to said second segment, and wherein gain clamped operation in said first segment is impeded when a bias current below the first threshold is provided to said second segment.

59. The semiconductor optical amplifier of claim 58, wherein said first and second segments of each of said multi-segment transverse lasers are electrically separated by an ion-implanted region.

60. The semiconductor optical amplifier of claim 59, wherein said ion-implanted region comprises a disordered quantum well, whereby said first and second cavity are substantially electrically isolated but not substantially optically isolated.

61. The semiconductor optical amplifier of claim 58, said gain medium of said signal waveguide providing linear amplification when integral with a gain-clamped first segment of one of said multi-segment transverse lasers, said gain medium of said signal waveguide exhibiting nonlinear effects when integral with a non-gain-clamped first segment of one of said multi-segment transverse lasers, wherein each of said second segments of said multi-segment transverse lasers may be dynamically modulated above and below said first threshold level.

62. The semiconductor optical amplifier of claim 61, wherein a first of said multi-segment transverse lasers has a gain-clamped first segment, and wherein a second of said multi-segment transverse lasers simultaneously has a non-gain-clamped first segment, the semiconductor optical amplifier providing linear, gain-stabilized amplification along a first portion of the signal waveguide associated with said first multi-segment transverse laser, the semiconductor optical amplifier providing nonlinear, gain-instable amplification along a second portion of the signal waveguide associated with said second multi-segment transverse laser.

63. A monolithic semiconductor optical amplifier, comprising:
a first signal waveguide for receiving and guiding an optical signal, the first signal waveguide comprising a gain medium;
a plurality of transverse laser cavities electrically isolated from each other and intersecting the first signal waveguide such that a population inversion in the gain medium of the first signal waveguide is facilitated by lasing fields in the transverse laser cavities, the optical signal thereby being amplified as it is guided along the first signal waveguide.

64. The monolithic semiconductor optical amplifier of claim 63, further comprising:
a second signal waveguide positioned near said first signal waveguide such that transfer of the optical signal from said first waveguide to said second waveguide is facilitated but such that transfer of amplified spontaneous emission (ASE) from said first waveguide to said second waveguide is impeded.

65. The monolithic semiconductor optical amplifier of claim 64, further comprising an output at an end of said second waveguide.

66. The monolithic semiconductor optical amplifier of claim 65, said second signal waveguide providing passive guidance of the optical signal without optical amplification thereof.

67. The monolithic semiconductor optical amplifier of claim 66, said second signal waveguide comprising a disordered quantum well.

68. The monolithic semiconductor optical amplifier of claim 64, said second signal waveguide comprising a gain medium, wherein at least one of said plurality of transverse laser cavities also intersects the second signal waveguide such that a population inversion in the gain medium of the second signal waveguide is facilitated by the lasing field of that transverse laser cavity, the optical signal also being amplified as it is guided along the second signal waveguide.

69. The monolithic semiconductor optical amplifier of claim 64, wherein said second waveguide is tunably coupled with said first waveguide.

70. The monolithic semiconductor optical amplifier of claim 69, wherein said tunable coupling between said first and second signal waveguides is controlled by an electrical signal.

71. A variable optical attenuator, comprising:
a signal waveguide for guiding an optical signal in a first direction;
at least one transverse laser oriented in a second direction not parallel to said first direction, each transverse laser comprising a gain medium, each transverse laser laterally intersecting said signal waveguide such that its gain medium lies within an upper and a lower boundary of said signal waveguide at said lateral intersection, wherein the optical signal traveling in said first direction experiences tunable gain upon encountering each of said lateral intersections according to a tunable bias current in that transverse laser;
at least one passive segment integral with said signal waveguide and lying outside said lateral intersections with said transverse lasers, wherein the optical signal traveling in said first direction experiences a predetermined attenuation upon encountering each passive segment;
wherein said tunable bias currents are adjusted such that a collective gain experienced by the optical signal at said lateral intersections with said transverse lasers is outweighed by a collective attenuation experienced by the optical signal in said passive segments, thereby providing a tunable attenuation to the optical signal.

72. The variable optical attenuator of claim 71, said variable optical attenuator comprising at least two of said transverse lasers, said transverse lasers being substantially parallel to each other, said passive segments being positioned between respective transverse lasers along said first direction, wherein said transverse lasers are electrically isolated from each other across said passive segments.

73. The apparatus of claim 72, wherein said first direction is substantially perpendicular to said second direction.

74. The apparatus of claim 72, wherein said first direction is separated from said second direction by a Brewster angle.

75. A semiconductor optical amplifier, comprising:
- a first signal waveguide for receiving and guiding an optical signal, the first signal waveguide comprising a gain medium;
- a plurality of transverse laser cavities electrically isolated from each other and intersecting the first signal waveguide such that a population inversion in the gain medium of the first signal waveguide is facilitated by lasing fields in the transverse laser cavities, the optical signal thereby being amplified as it is guided along the first signal waveguide; and
- a second signal waveguide tunably coupled to said first signal waveguide such that tunable transfer of the optical signal from said first waveguide to said second waveguide is facilitated but such that transfer of amplified spontaneous emission (ASE) from said first waveguide to said second waveguide is impeded.

76. The semiconductor optical amplifier of claim 75, wherein said tunable coupling between said first and second signal waveguides is controlled by a control signal selected from the group consisting of: electrical control signals, optical control signals, and mechanical control signals.

77. The semiconductor optical amplifier of claim 76, said second signal waveguide providing passive guidance of the optical signal without optical amplification thereof.

78. The semiconductor optical amplifier of claim 76, said second signal waveguide comprising a gain medium, wherein at least one of said plurality of transverse laser cavities also intersects the second signal waveguide such that a population inversion in the gain medium of the second signal waveguide is facilitated by the lasing field of that transverse laser cavity, the optical signal also being amplified as it is guided along the second signal waveguide.

* * * * *